United States Patent
Ko et al.

(10) Patent No.: US 10,431,759 B2
(45) Date of Patent: Oct. 1, 2019

(54) ELECTRON TRANSPORT LAYER FOR FLEXIBLE PEROVSKITE SOLAR CELL AND FLEXIBLE PEROVSKITE SOLAR CELL INCLUDING THE SAME

(71) Applicant: KOREA INSTITUTE OF SCIENCE AND TECHNOLOGY, Seoul (KR)

(72) Inventors: Min Jae Ko, Seoul (KR); Jin Joo, Daegu (KR); Hae Jung Son, Seoul (KR); Jai Kyeong Kim, Seoul (KR); Doh-Kwon Lee, Seoul (KR); Inyoung Jeong, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 30 days.

(21) Appl. No.: 15/402,464

(22) Filed: Jan. 10, 2017

(65) Prior Publication Data
US 2017/0288159 A1    Oct. 5, 2017

(30) Foreign Application Priority Data
Apr. 1, 2016    (KR) .......................... 10-2016-0040165

(51) Int. Cl.
*H01L 51/42*    (2006.01)
*H01L 51/00*    (2006.01)

(52) U.S. Cl.
CPC ...... *H01L 51/4226* (2013.01); *H01L 51/4246* (2013.01); *H01L 51/0097* (2013.01); *Y02E 10/549* (2013.01)

(58) Field of Classification Search
CPC .................................................. H01L 51/4226
See application file for complete search history.

(56) References Cited

U.S. PATENT DOCUMENTS

| | | | |
|---|---|---|---|
| 2006/0254461 A1* | 11/2006 | Hong | B01J 31/1815 106/287.19 |
| 2012/0227807 A1* | 9/2012 | Kato | H01L 51/447 136/257 |
| 2015/0243444 A1 | 8/2015 | Irwin et al. | |

FOREIGN PATENT DOCUMENTS

| | | | |
|---|---|---|---|
| JP | 2003252624 A | * | 9/2003 |
| JP | 2011-171082 A | | 9/2011 |
| JP | 2011171082 A | * | 9/2011 |
| KR | 1020100111117 A | | 10/2010 |
| KR | 1020140003998 A | | 1/2014 |

OTHER PUBLICATIONS

JP2003-252624, machine translation, 2003. (Year: 2003).*
JP2011-171082, machine translation, 2011. (Year: 2011).*
(Continued)

*Primary Examiner* — Robert A Vetere
(74) *Attorney, Agent, or Firm* — Godlilocks Zone IP Law

(57) ABSTRACT

Disclosed is an electron transport layer for a flexible perovskite solar cell. The electron transport layer includes transition metal-doped titanium dioxide particles. The titanium dioxide particles are densely packed in the electron transport layer. The electron transport layer is transparent. The use of the electron transport layer enables the fabrication of a flexible perovskite solar cell with high power conversion efficiency. Also disclosed is a flexible perovskite solar cell employing the electron transport layer.

6 Claims, 19 Drawing Sheets

(56) References Cited

OTHER PUBLICATIONS

Mincuzzi et al., "Efficient sintering of nanocrystalline titanium dioxide films for dye solar cells via raster scanning laser," 2009, Appl. Phys. Lett., 95, 103312. (Year: 2009).*

Zen et al., "Low-temperature-sintered Dye-sensitized Solar Cell Using Surface Treatment of $TiO_2$ Photoelectrode with Ultraviolet Light," 2013, Chem. Lett., 42, 624-626. (Year: 2013).*

Atashbar et al., "XPS study of Nb-doped oxygen sensing $TiO_2$ thin films prepared by sol-gel method," Thin Solid Films 326 (1998), pp. 238-244. (Year: 1998).*

\* cited by examiner

ELECTRON TRANSPORT LAYER FOR FLEXIBLE PEROVSKITE SOLAR CELL AND FLEXIBLE PEROVSKITE SOLAR CELL INCLUDING THE SAME

CROSS-REFERENCE TO RELATED APPLICATIONS

This application claims, under 35 U.S.C. § 119, the priority of Korean Patent Application No. 10-2016-0040165, filed on Apr. 1, 2016 in the Korean Intellectual Property Office, the disclosure of which is incorporated herein by reference in its entirety.

BACKGROUND OF THE INVENTION

1. Field of the Invention

The present invention relates to a transparent electron transport layer for a flexible perovskite solar cell in which titanium dioxide particles are densely packed and a flexible perovskite solar cell with high power conversion efficiency employing the electron transport layer.

2. Description of the Related Art

With the development of modern society, the consumption of various forms of energy has been rapidly increasing year by year. Under such circumstances, the depletion of fossil fuels as major sources of energy for modern industry and environmental pollution problems are the most urgent challenges facing the human race and sustained research efforts have been made around the world to develop renewable environmentally friendly energy sources.

The earth receives annually $3 \times 10^{21}$ kJ of solar energy as an inexhaustible source of clean energy, which corresponds to 10,000 times the world's energy consumption. Typical technologies for converting an enormous amount of solar energy into necessary energy forms, such as electricity and heat, are water splitting and solar cells based on the photovoltaic effect.

Particularly, solar cells are widely used to produce electricity, which accounts for 25% of the world's eco-friendly energy production. If solar cells with an efficiency of 10% are installed to cover 0.1% of the earth's surface area through active development and utilization, they can produce the amount of energy that is currently consumed. An increase in the efficiency of solar cells will provide a sufficient amount of energy from a reduced number of solar cells.

A wind of change is currently blowing in solar cell research. Solid-state perovskite solar cells (SCs) employing organic-inorganic hybrid perovskite absorbers were first reported in 2012 and recorded an efficiency as high as 20.1% in the three years since then, which has prompted researchers to develop next-generation solar cells that had been academically inactive for the past decade.

The perovskite solar cells are solar cell devices that use an organic-inorganic hybrid perovskite as an absorber. The perovskite solar cells meet most of the requirements of existing next-generation solar cells, including high efficiency, low material costs, and low-temperature processability or low-cost solution processability. Due to these advantages, the perovskite solar cells are attracting attention as new solar cells that have the potential to replace silicon solar cells.

The reason for high photoelectric conversion efficiency of perovskite solar cells is that perovskite absorber layers absorb a sufficient amount of light even at a thickness of 0.5 µm or less due to their high visible light transmittance and generate many charges.

An electron transport layer (ETL) is an important element for high performance of a flexible perovskite solar cell (PSC) and needs to be sintered at a high temperature of at least 450° C., which impedes the fabrication of a perovskite solar cell on a flexible polymer substrate, such as a polyethylene naphthalate (PEN) or polyethylene terephthalate (PET) substrate. Therefore, development of a low-temperature processable electron transport layer (ETL) is important for realizing a high performance flexible perovskite solar cell (PSC).

Various metal oxides ($TiO_2$, $NiO_x$, $Zn_2SnO_4$, ZnO, etc.) based on low-temperature processes have recently been proposed as materials for electron transport layers (ETLs) of flexible perovskite solar cells (PSCs). The $Zn_2SnO_4$- and ZnO-based flexible perovskite solar cells (PSCs) showed impressive power conversion efficiencies of 15.3% and 15.6%, respectively, and the $TiO_2$ electron transport layer (ETL)-based flexible perovskite solar cells (PSCs) showed a PCE of 15.07% too.

The preparation of $TiO_2$ thin films by low-temperature processes involves vacuum deposition of a Ti source in an $O_2$/Ar environment, such as atomic layer deposition (ALD) or sputtering. Vacuum deposition shows good results in terms of performance but incurs a considerable cost.

Thus, there is a need for an electron transport layer for a flexible perovskite solar cell that can be calcined at low temperature and can be prepared at reduced cost by a solution coating process.

PRIOR ART DOCUMENTS

Patent Documents

Korean Patent No. 1430139
Korean Patent Publication No. 2010-0111117

SUMMARY OF THE INVENTION

It is one object of the present invention to provide a transparent electron transport layer for a flexible perovskite solar cell in which titanium dioxide particles are densely packed.

It is a further object of the present invention to provide a method for preparing the electron transport layer.

It is another object of the present invention to provide a flexible perovskite solar cell including the electron transport layer.

According to one aspect of the present invention, there is provided an electron transport layer for a flexible perovskite solar cell including transition metal-doped titanium dioxide particles treated with UV.

The titanium dioxide may have a diameter of 0.5 to 3 nm.

The transition metal may be selected from Group 3 transition metals consisting of scandium (Sc), yttrium (Y), and lanthanum (La), Group 5 transition metals consisting of niobium (Nb), vanadium (V), and tantalum (Ta), and combinations thereof.

According to a further aspect of the present invention, there is provided a method for preparing an electron transport layer for a flexible perovskite solar cell, including (A) mixing a titanium precursor, a transition metal precursor, and an organic ligand to prepare transition metal-doped titanium dioxide particles and (B) irradiating the transition metal-doped titanium dioxide particles with UV.

In step (A), the transition metal precursor may be selected from the group consisting of scandium (III) triflate, yttrium borate, yttrium acetate hydrate, lanthanum nitrate, niobium ethoxide isopropoxide, niobium alkoxides, ammonium metavanadate, tantalum ethoxide, and mixtures thereof.

In step (A), the transition metal precursor may be included in an amount of 1 to 5 mol %, based on the total weight of the mixture of the titanium precursor, the transition metal precursor, and the organic ligand.

In step (A), the titanium precursor and the organic ligand may be mixed in a molar ratio of 1:2-5.

In step (A), the mixture of the titanium precursor, the transition metal precursor, and the organic ligand may be heated at 250 to 300° C. for 1 to 3 hours.

In step (B), the transition metal-doped titanium dioxide particles may be irradiated with UV for 40 to 120 minutes.

According to another aspect of the present invention, there is provided a flexible perovskite solar cell including a substrate, the electron transport layer disposed on the substrate, a perovskite layer disposed on the electron transport layer, and a hole transport layer disposed on the perovskite layer, and an electrode layer disposed on the hole transport layer.

The flexible perovskite solar cell may have an open-circuit voltage of 1.09 to 1.13 V, a short-circuit current density of 22.0 to 23.0 mAcm$^{-2}$, a fill factor of 0.75 to 0.80, and a power conversion efficiency of 17 to 20%.

The substrate may be fluorine-doped tin oxide (FTO) glass, indium tin oxide (ITO) glass or indium tin oxide/polyethylene naphthalate (ITO/PEN).

The electron transport layer of the present invention includes densely packed titanium dioxide particles and is transparent, achieving high performance. The use of the electron transport layer enables the fabrication of a flexible perovskite solar cell with excellent characteristics in terms of short-circuit current density, open-circuit voltage, fill factor, and power conversion efficiency.

In addition, the electron transport layer of the present invention can be sintered at low temperature by UV treatment and can be prepared at reduced cost by a solution coating process.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1A:
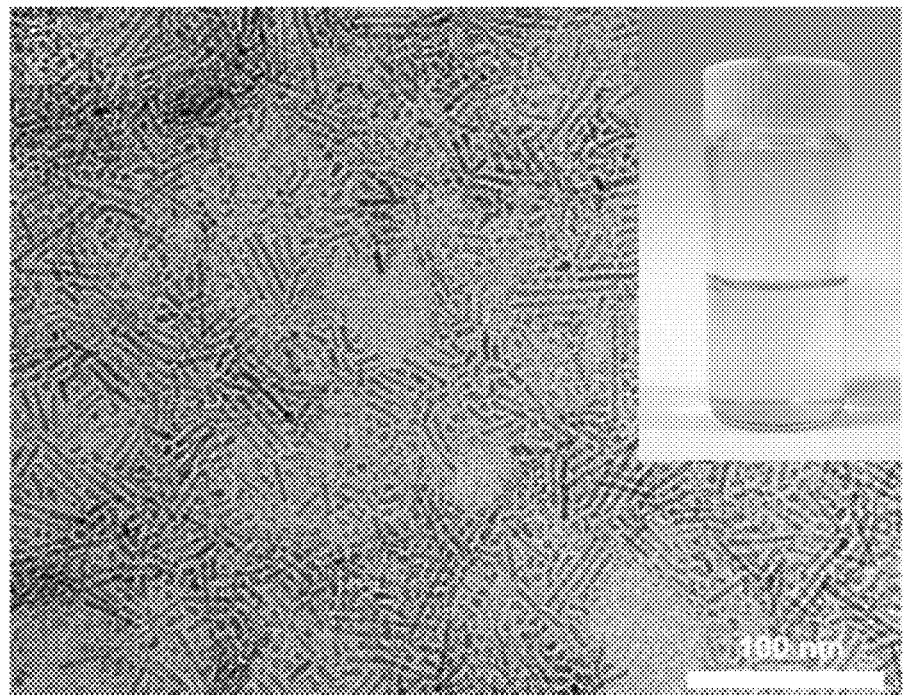
FIGS. 1A and 1B are high-resolution transmission electron microscopy (HR-TEM) images of titanium dioxide particles capped with an organic ligand at different magnifications.

The present invention is directed to a transparent electron transport layer for a flexible perovskite solar cell in which titanium dioxide particles are densely packed and a flexible perovskite solar cell (PSC) with high power conversion efficiency employing the electron transport layer.

Particularly, the electron transport layer of the present invention can be sintered at a low temperature of 30 to 50° C. through UV treatment, unlike conventional electron transport layers that are sintered at high temperatures. The UV treatment allows dense packing of the titanium dioxide particles and makes the electron transport layer transparent. The use of the electron transport layer ensures high performance of the flexible perovskite solar cell (PSC) and allows the flexible perovskite solar cell to have advantageous characteristics in terms of short-circuit current density, open-circuit voltage, fill factor, and power conversion efficiency.

The present invention will now be described in more detail.

The present invention provides an electron transport layer for a flexible perovskite solar cell including transition metal-doped titanium dioxide particles treated with UV (for example, UV-Nb:$TiO_2$).

The titanium dioxide particles have a diameter of 0.5 to 3 nm, preferably 1.5 to 3 nm. Outside this range, the transparency of the electron transport layer may be lowered.

The transition metal contributes to improvement of electrical conductivity and charge extraction without affecting the optical properties of the electron transport layer. Examples of suitable transition metals include Group 3 transition metals and/or Group 5 transition metals. Preferably, the transition metal is selected from the group consisting of scandium (Sc), yttrium (Y), lanthanum (La), niobium (Nb), vanadium (V), tantalum (Ta), and combinations thereof. If a metal other than the transition metal is used, an improvement in charge extraction is not expected and high performance of the electron transport layer cannot be ensured.

The transition metal precursor is used in an amount of 1 to 5 mol %, preferably 1 to 2 mol %, based on the total weight of the mixture of the transition metal and the titanium dioxide particles. If the content of the transition metal is less than the lower limit defined above, improvement of electrical conductivity and charge extraction cannot be expected. Meanwhile, if the content of the transition metal exceeds the upper limit defined above, low charge extraction may also be caused.

The UV treatment of the transition metal-doped titanium dioxide particles provides the following advantages. First, the UV treatment induces fusion of the titanium dioxide particles, allowing their dense packing. Second, the UV treatment enables the removal of an organic ligand that is necessary for the preparation of the titanium dioxide particles but causes deterioration of photovoltaic performance due to the presence of its long alkyl chain.

The present invention also provides a method for preparing an electron transport layer for a flexible perovskite solar cell.

The method includes (A) mixing a titanium precursor, a transition metal precursor, and an organic ligand to prepare transition metal-doped titanium dioxide particles and (B) irradiating the transition metal-doped titanium dioxide particles with UV.

First, in step (A), transition metal-doped titanium dioxide particles are prepared.

The transition metal-doped titanium dioxide particles are prepared by heating a titanium precursor, a transition metal precursor, and an organic ligand at 250 to 300° C., preferably 260 to 280° C., for 1 to 3 hours, preferably 1.5 to 2 hours. If the heating temperature and time are less than the respective lower limits defined above, desired effects cannot be obtained. Meanwhile, if the heating temperature and time exceed the respective upper limits defined above, a large amount of impurities is produced.

The titanium precursor is not limited to a particular kind but is preferably titanium isopropoxide.

The transition metal precursor is used in an amount of 1 to 5 mol %, preferably 1 to 2 mol %, based on the total weight of the mixture of the titanium precursor, the transition metal precursor, and the organic ligand. If the content of the transition metal is less than the lower limit defined above, improvement of electrical conductivity and charge extraction cannot be expected. Meanwhile, if the content of the transition metal exceeds the upper limit defined above, low charge extraction may also be caused.

The transition metal precursor is not particularly limited but is preferably selected from the group consisting of scandium (III) triflate, yttrium borate, yttrium acetate hydrate, lanthanum nitrate, niobium ethoxide isopropoxide, niobium alkoxides, ammonium metavanadate, tantalum ethoxide, and mixtures thereof. More preferred is niobium ethoxide isopropoxide.

The organic ligand is not particularly limited so long as it can cap and disperse titanium dioxide particles without aggregation. The organic ligand is preferably selected from the group consisting of oleic acid, oleylamine, linoleic acid, stearic acid, and mixtures thereof.

The titanium precursor and the organic ligand are mixed in a molar ratio of 1:2-5, preferably 1:2-3. If the ratio of the organic ligand to the titanium precursor is less than 2, titanium dioxide particles may aggregate, resulting in poor performance. Meanwhile, if the ratio of the organic ligand to the titanium precursor exceeds 5, the organic ligand may remain unremoved despite UV treatment, resulting in poor photovoltaic performance.

Next, in step (B), the transition metal-doped titanium dioxide particles are irradiated with UV.

The transition metal-doped titanium dioxide particles are irradiated with a UV lamp in the wavelength range of 200 to 400 nm for 40 to 120 minutes, preferably 50 to 70 minutes.

The present invention also provides a flexible perovskite solar cell including the electron transport layer.

The flexible perovskite solar cell of the present invention includes a substrate, the electron transport layer (e.g., UV-Nb:$TiO_2$) disposed on the substrate, a perovskite layer disposed on the electron transport layer, and a hole transport layer disposed on the perovskite layer, and an electrode layer disposed on the hole transport layer.

The flexible perovskite solar cell has an open-circuit voltage ($V_{oc}$) of 1.09 to 1.13 V, a short-circuit current density ($J_{sc}$) of 22.0 to 23.0 mAcm$^{-2}$, a fill factor (FF) of 0.75 to 0.80, and a power conversion efficiency (PCE) of 17 to 20%.

The substrate may be, for example, fluorine-doped tin oxide (FTO) glass, indium tin oxide (ITO) glass or indium tin oxide/polyethylene naphthalate (ITO/PEN). The ITO/PEN refers to a substrate in which ITO is bonded to PEN.

The following examples are provided to assist in further understanding of the invention. However, these examples are intended for illustrative purposes only. It will be evident to those skilled in the art that various modifications and changes can be made without departing from the scope and spirit of the invention and such modifications and changes are encompassed within the scope of the appended claims.

Example 1: Preparation of UV-Nb:$TiO_2$ (Electron Transport Layer)

Preparation of Nb:$TiO_2$ (Nb-Doped Titanium Dioxide Particles)

Nb-doped titanium dioxide particles were synthesized via a non-hydrolytic sol-gel reaction.

88 mmol of oleic acid (OA, Sigma Aldrich, 93%) and niobium (V) ethoxide (Aldrich; 99.95%, 1 mol % and 2 mol %, based on the total weight of the mixture) were degassed in a three-neck flask under vacuum. 1 h later, 30 mmol of titanium (IV) isopropoxide (TTIP; Aldrich; 97%) was added to the flask. The mixture was vigorously stirred at 270° C. for 2 h. When the color of the mixture turned from transparent yellow to white, the mixture was again degassed with 99.99% argon gas, giving a precipitate ($Nb:TiO_2$).

The precipitate was washed with excess ethanol and purified by centrifugation at 3000 rpm for 30 min.

Preparation of UV Treated $UV-Nb:TiO_2$

The purified $Nb:TiO_2$ was re-dispersed in hexane at a predetermined concentration. The $Nb:TiO_2$ dispersion was dropped onto a TCO substrate (FTO glass or ITO/PEN) and immediately spin-coated at a rate of 5000 rpm. Thereafter, the $Nb:TiO_2$-coated TCO substrate was irradiated with a UV lamp curing system (JHCI-051B, JECO) equipped with a 400 W mercury lamp (wavelength range 200-400 nm) to prepare $UV-Nb:TiO_2$.

Comparative Example 1: Preparation of $HT-TiO_2$ (Electron Transport Layer)

A titanium diisopropoxide bis(acetylacetonate) solution (75% in isopropanol, Aldrich) was spin-coated on a TCO substrate (FTO glass or ITO/PEN) and annealed at 500° C. for 30 min to prepare high temperature sintered $HT-TiO_2$.

Comparative Example 2: Preparation of $UV-TiO_2$ (Electron Transport Layer)

Preparation of $TiO_2$

Undoped titanium dioxide particles were synthesized via a non-hydrolytic sol-gel reaction.

88 mmol of oleic acid (OA, Sigma Aldrich, 93%) was degassed in a three-neck flask under vacuum. 1 h later, 30 mmol of titanium (IV) isopropoxide (TTIP; Aldrich; 97%) was added to the flask. The mixture was vigorously stirred at 270° C. for 2 h. When the color of the mixture turned from transparent yellow to white, the mixture was again degassed with 99.99% argon gas, giving a precipitate ($TiO_2$).

The precipitate was washed with excess ethanol and purified by centrifugation at 3000 rpm for 30 min.

Preparation of UV Treated $UV-TiO_2$

The purified $TiO_2$ was re-dispersed in hexane at a predetermined concentration. The $TiO_2$ dispersion was dropped onto a TCO substrate (FTO glass or ITO/PEN) and immediately spin-coated at a rate of 5000 rpm. Thereafter, the $TiO_2$-coated TCO substrate was irradiated with a UV lamp curing system (JHCI-051B, JECO) equipped with a 400 W mercury lamp (wavelength range 200-400 nm) to prepare $UV-TiO_2$.

Test Example 1: Comparison of Undoped $TiO_2$, $Nb:TiO_2$ (Nb 1 Mol %), and $Nb:TiO_2$ (Nb 2 Mol %)

Figure 1B:
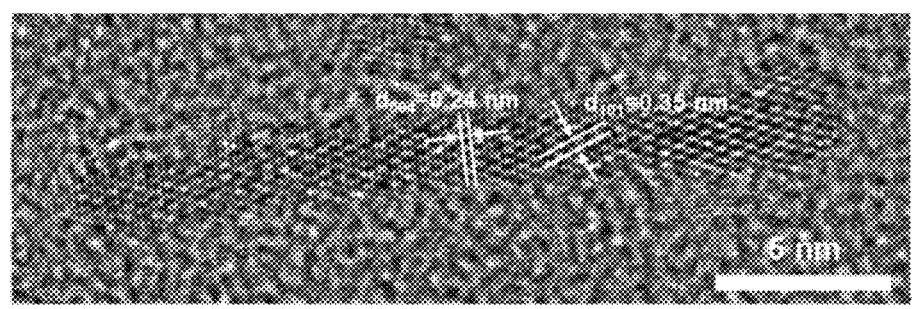

FIGS. 1A and 1B are high-resolution transmission electron microscopy (HR-TEM) images of the organic ligand (OA)-capped titanium dioxide particles at different magnifications.

As shown in FIG. 1, the organic ligand-capped titanium dioxide particles are grown along the [001] direction and are highly crystalline. The spacings between the lattice fringes are 0.35 nm and 0.24 nm, which correspond to the $d_{101}$ and $d_{004}$ spacings of the anatase crystalline structure, respectively.

Figure 2A:
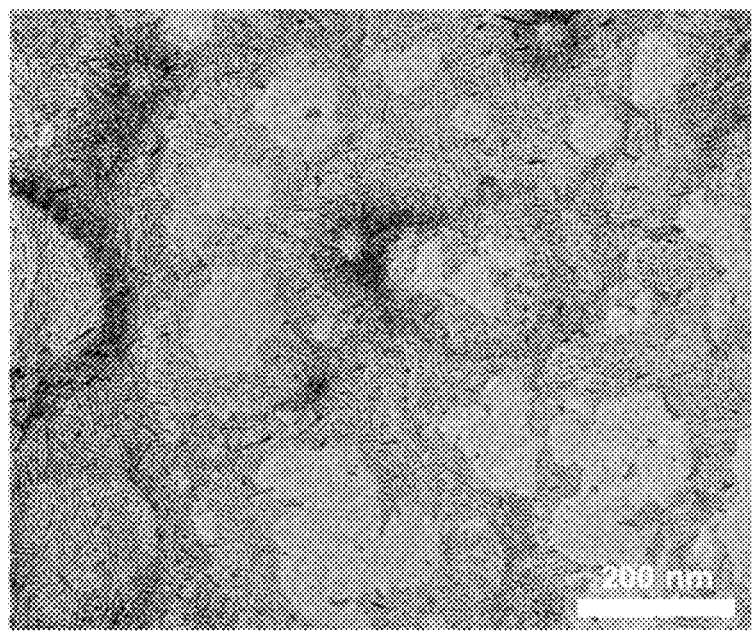
FIGS. 2A and 2B are high-resolution transmission electron microscopy (HR-TEM) images of Nb:TiO$_2$ (Nb 1 mol %) and Nb:TiO$_2$ (Nb 2 mol %), respectively.
Figure 2B:
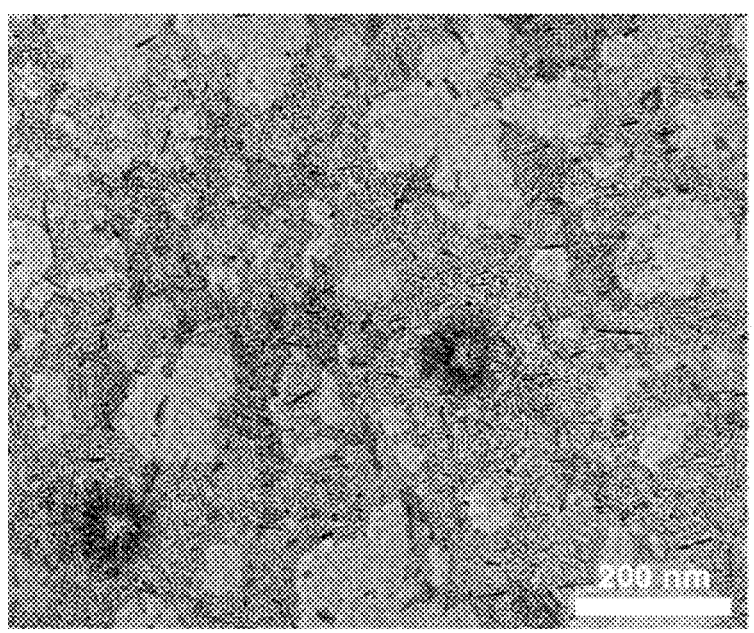
Figure 2C:
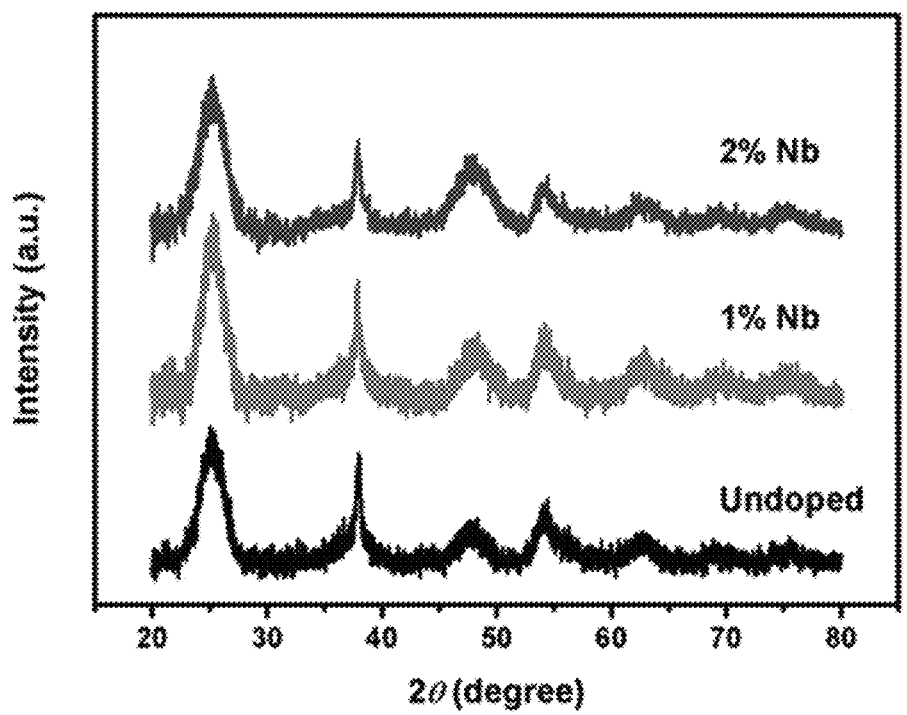
FIG. 2C shows powder XRD patterns of undoped TiO$_2$, Nb:TiO$_2$ (Nb 1 mol %), and Nb:TiO$_2$ (Nb 2 mol %)
Figure 2D:
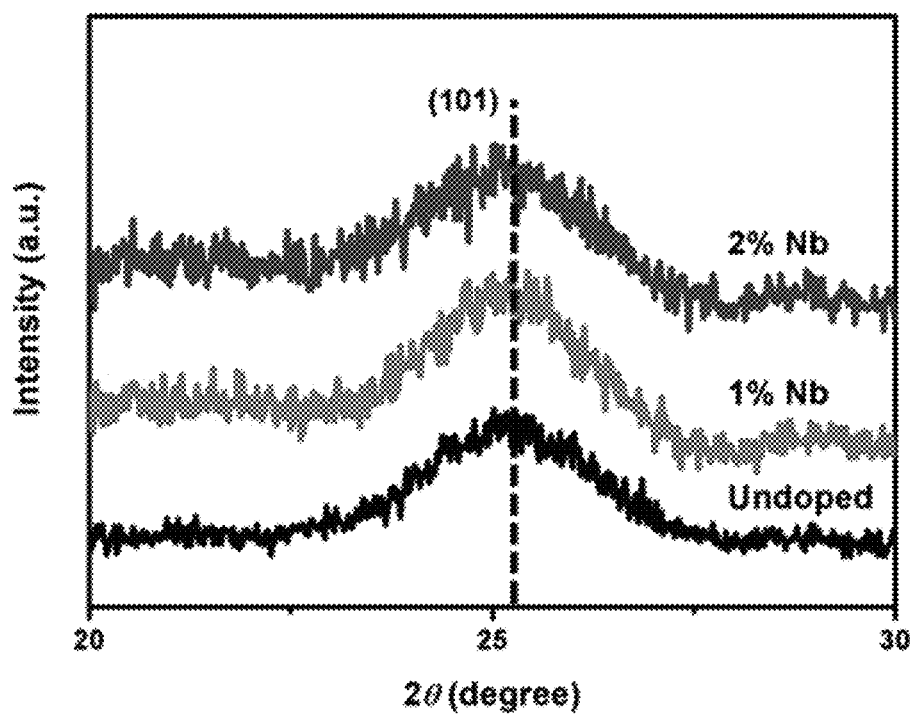
FIG. 2D shows details of XRD patterns of undoped TiO$_2$, Nb:TiO$_2$ (Nb 1 mol %), and Nb:TiO$_2$ (Nb 2 mol %) at 2θ of around 25°.

FIGS. 2A and 2B are high-resolution transmission electron microscopy (HR-TEM) images of the $Nb:TiO_2$ (Nb 1 mol %) and the $Nb:TiO_2$ (Nb 2 mol %), respectively, FIG. 2C shows powder XRD patterns of the undoped $TiO_2$, the $Nb:TiO_2$ (Nb 1 mol %), and the $Nb:TiO_2$ (Nb 2 mol %), and FIG. 2D shows details of XRD patterns of the undoped $TiO_2$, the $Nb:TiO_2$ (Nb 1 mol %), and the $Nb:TiO_2$ (Nb 2 mol %) at 2θ of around 25°.

As shown in FIGS. 2A and 2B, there is no difference in the crystal morphology of the nanoparticles despite the different Nb contents.

As shown in FIGS. 2C and 2D, the X-ray diffraction (XRD) peaks for the undoped $TiO_2$ and the $Nb:TiO_2$ nanoparticles showed an anatase crystal structure (JCPDS, No. 76-1940), which was maintained with increasing Nb content. The sharp (004) peaks at 37.8° show anisotropic growth of the $TiO_2$ nanoparticles, which is in agreement with the HR-TEM image of the $TiO_2$ nanorods in FIG. 1B. A slight shift in the (101) peak with increasing Nb content is because of the larger radius of $Nb^{5+}$ (0.64 Å) than $Ti^{4+}$ (0.61 Å).

Moreover, the XRD patterns reveal that the $Nb:TiO_2$ nanoparticles were successfully prepared without by-products, such as $Nb_2O_5$.

Figure 3:
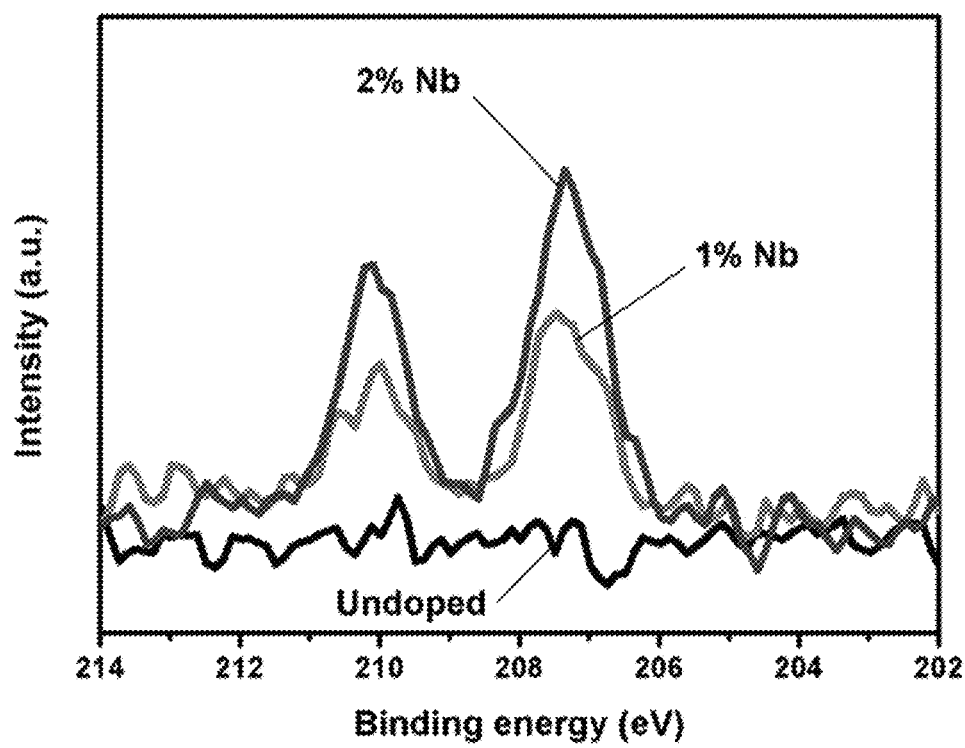
FIG. 3 shows X-ray photoelectron spectra of undoped TiO$_2$, Nb:TiO$_2$ (Nb 1 mol %), and Nb:TiO$_2$ (Nb 2 mol %)

FIG. 3 shows X-ray photoelectron spectra of the undoped $TiO_2$, the $Nb:TiO_2$ (Nb 1 mol %), and the $Nb:TiO_2$ (Nb 2 mol %).

As shown in FIG. 3, the $Nb:TiO_2$ (Nb 1 mol %) and the $Nb:TiO_2$ (Nb 2 mol %) showed two peaks at 207.3 eV and 210.1 eV corresponding to $3d_{5/2}$ and $Nb3d_{3/2}$ transitions, respectively, demonstrating the presence of $Nb^{5+}$ doped into the $TiO_2$ nanoparticles.

Test Example 2: Comparison of Examples 1 and Comparative Examples 1-2

The organic ligand capping the $TiO_2$ nanoparticles was dispersed without aggregation (the inset of FIG. 1A) but the long alkyl chain of the organic ligand serves as a barrier to charge transport and can deteriorate photovoltaic performance of the $TiO_2$ nanoparticles. Therefore, UV treatment was conducted to decompose the organic ligand used to introduce the photocatalytic effect of $TiO_2$ while at the same time preparing a high performance electron transport layer (ETL) by low temperature processing. The UV treatment enables removal of the organic ligand and induces fusion of the $TiO_2$ nanoparticles, resulting in high density of the $TiO_2$ nanoparticles.

The decomposition of the organic ligand was confirmed by attenuated total reflection-Fourier transform infrared spectroscopy (ATR-FTIR).

Figure 4A:
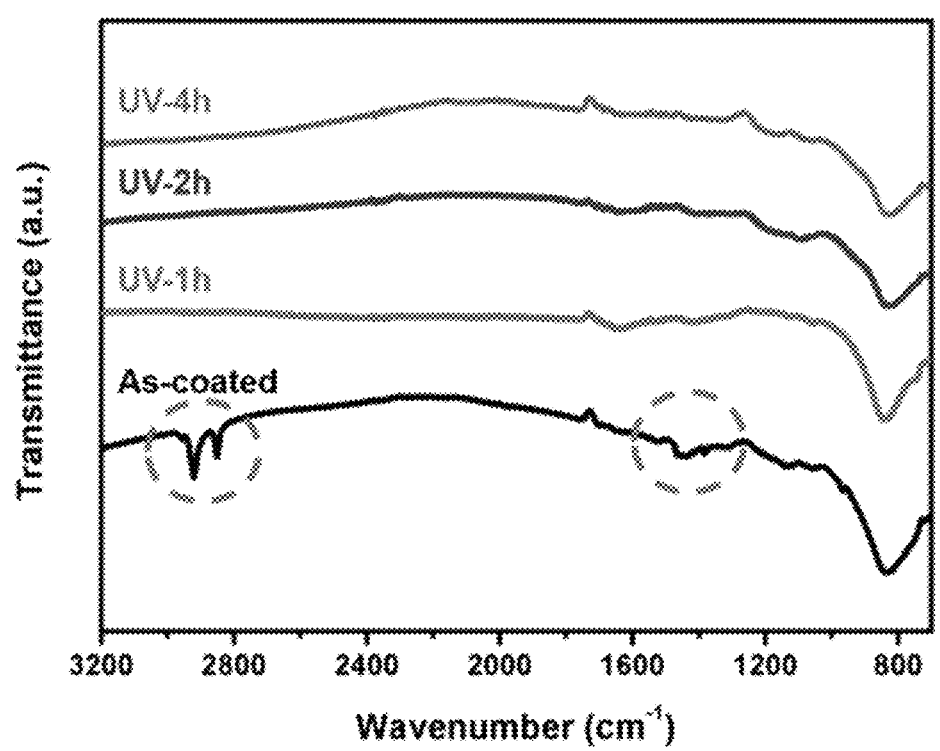
FIG. 4A shows ATR-FTIR spectra of TiO$_2$ nanoparticles before and after UV treatment.
Figure 4B:
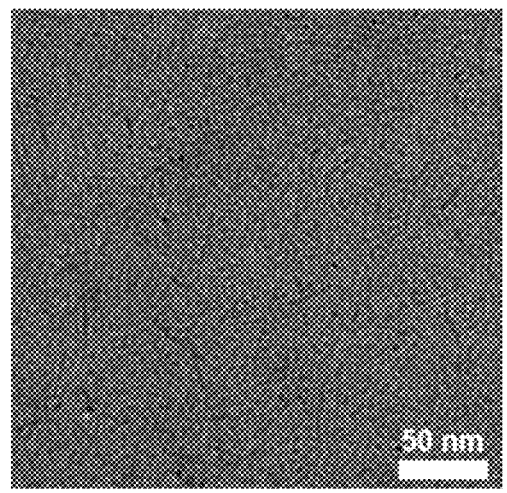
FIG. 4B is a TEM image of a TiO$_2$ thin film formed by spin coating of TiO$_2$ nanoparticles dispersed in hexane (before UV treatment)
Figure 4C:
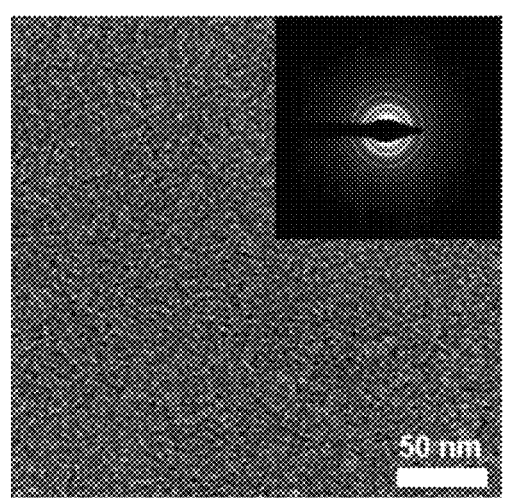
FIG. 4C is a TEM image of the TiO$_2$ thin film after UV treatment.
Figure 4D:
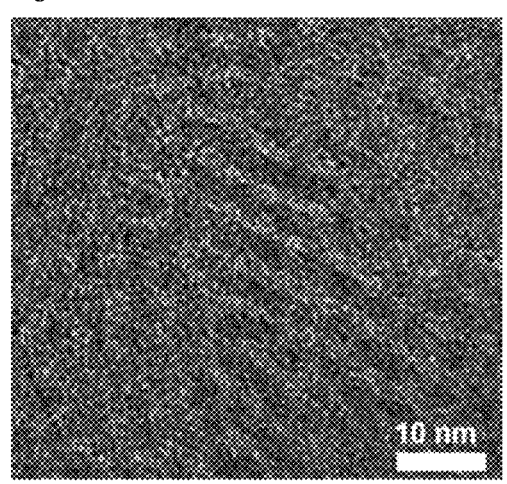
FIG. 4D is a HR-TEM image of FIG. 4B.
Figure 4E:
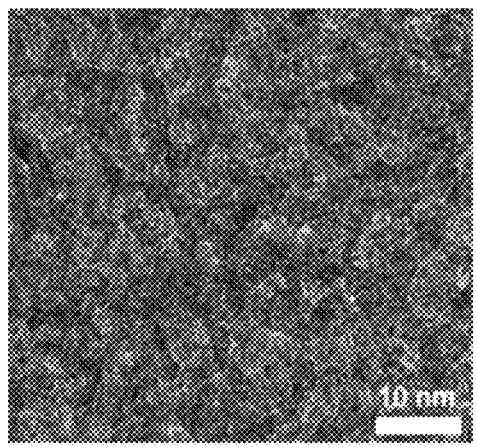
FIG. 4E is a HR-TEM image of FIG. 4C, the inset in the TEM image of FIG. 4C is the corresponding selected area electron diffraction (SAED) pattern.

FIG. 4A shows ATR-FTIR spectra of the $TiO_2$ nanoparticles before and after UV treatment, FIG. 4B is a TEM image of the $TiO_2$ thin film formed by spin coating of the $TiO_2$ nanoparticles dispersed in hexane (before UV treatment), FIG. 4C is a TEM image of the $TiO_2$ thin film after UV treatment, FIG. 4D is a HR-TEM image of FIG. 4B, and FIG. 4E is a HR-TEM image of FIG. 4C. The inset in the TEM image of FIG. 4C is the corresponding selected area electron diffraction (SAED) pattern.

As shown in FIG. 4A, the $TiO_2$ nanoparticles showed strong peaks at 2855 $cm^{-1}$ and 2925 $cm^{-1}$ corresponding to the symmetric and asymmetric $CH_2$ stretching vibration of the OA alkyl chain. Other peaks at 1425 $cm^{-1}$ and 1525 $cm^{-1}$ are ascribed to the symmetric and asymmetric stretching vibration of the carboxylate group of OA. The characteristic peaks of OA disappeared after UV exposure for 1 h or more, indicating the removal of OA.

As shown in FIGS. 4B to 4E, the coated $TiO_2$ thin film shows that the intervals between the nanoparticles are small and the nanoparticles are well-aligned due to the presence of the organic ligand (OA). The exposure of the $TiO_2$ film to UV led to the removal of the organic ligand (OA) and the fusion of the $TiO_2$ nanoparticles, making the film smaller and denser. This was clearly observed in FIG. 4E. Moreover, the selected area electron diffraction (SAED) pattern for the UV-$TiO_2$ film (the inset of FIG. 4C) indicates that the high degree of crystallization of the $TiO_2$ film appeared after UV treatment.

Figure 5:
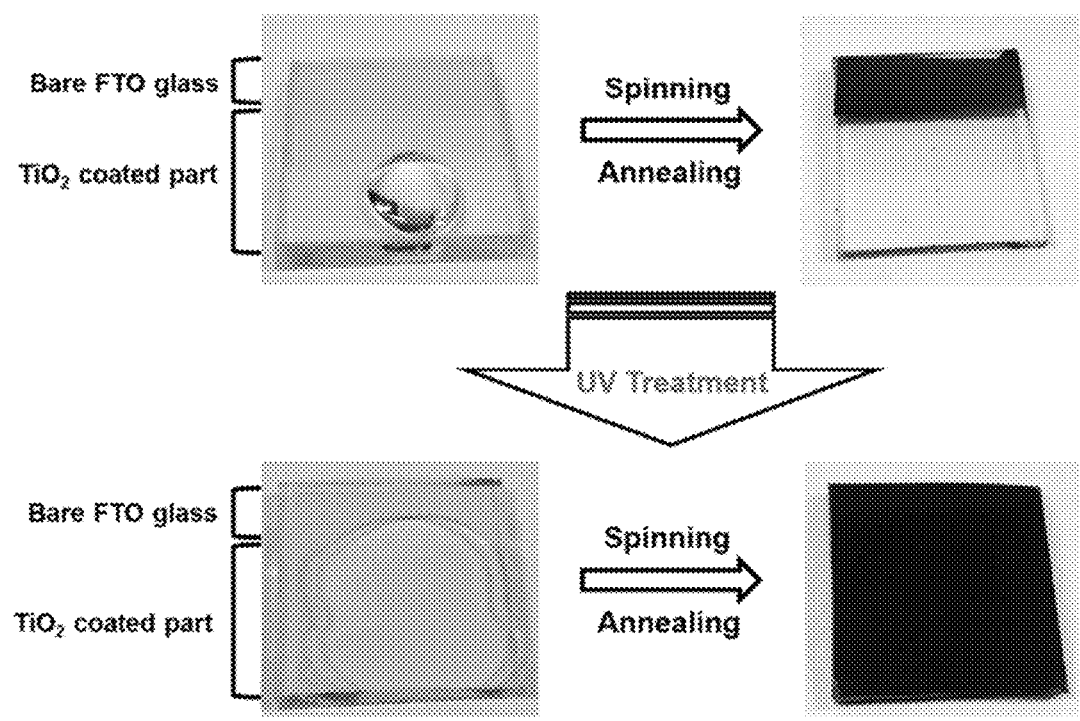
FIG. 5 shows the removal of an organic ligand capped on TiO$_2$ nanoparticles by UV treatment.

FIG. 5 shows the removal of the organic ligand capped on $TiO_2$ nanoparticles by UV treatment.

As shown in FIG. 5, the removal of the organic ligand (OA) after UV treatment caused a color change to darker. The $TiO_2$ surface became more hydrophilic by removal of the hydrophobic organic ligand (OA). Accordingly, the removal of the organic ligand (OA) by UV treatment is verified by improved wettability of the perovskite precursor solution in the $TiO_2$ layer.

Figure 6A:
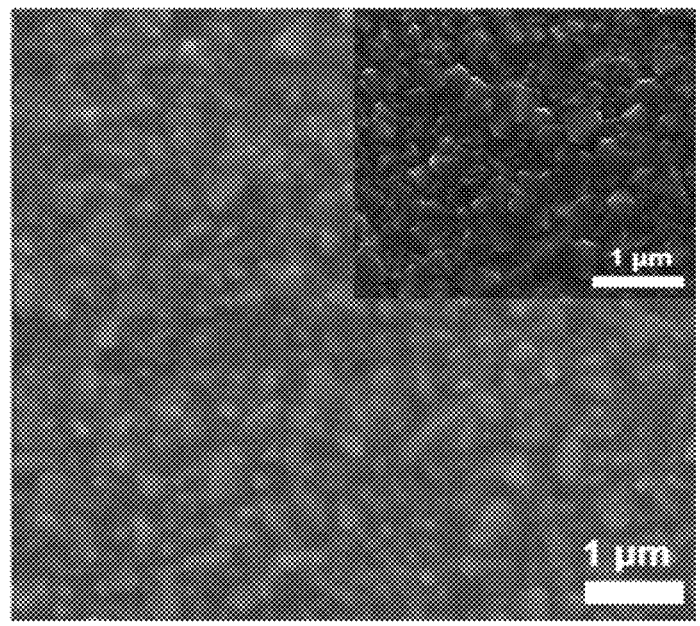
FIG. 6A is a SEM image showing the surface of HT-TiO$_2$-coated FTO glass prepared in Comparative Example 1.
Figure 6B:
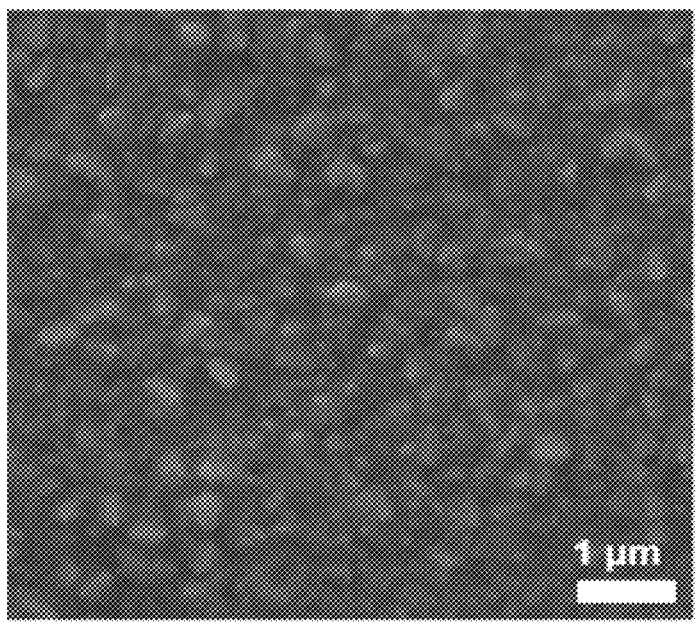
FIG. 6B is a SEM image showing the surface of UV-TiO$_2$-coated FTO glass prepared in Comparative Example 2.
Figure 6C:
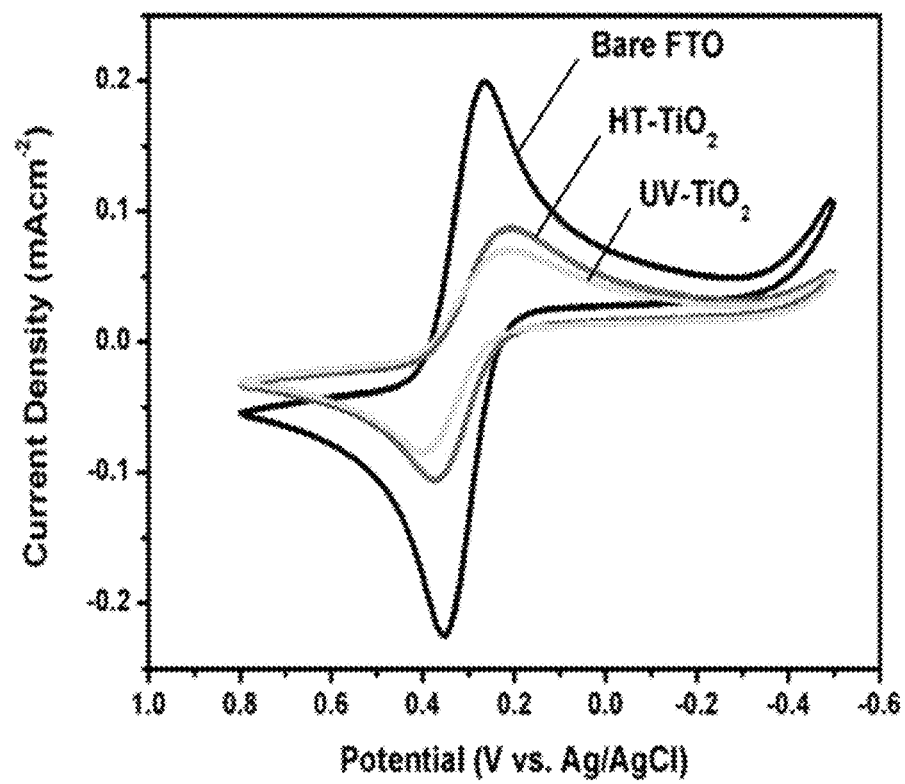
FIG. 6C shows cyclic voltammograms of FTO glass, HT-TiO$_2$-coated FTO glass, and UV-TiO$_2$-coated FTO glass.
Figure 6D:
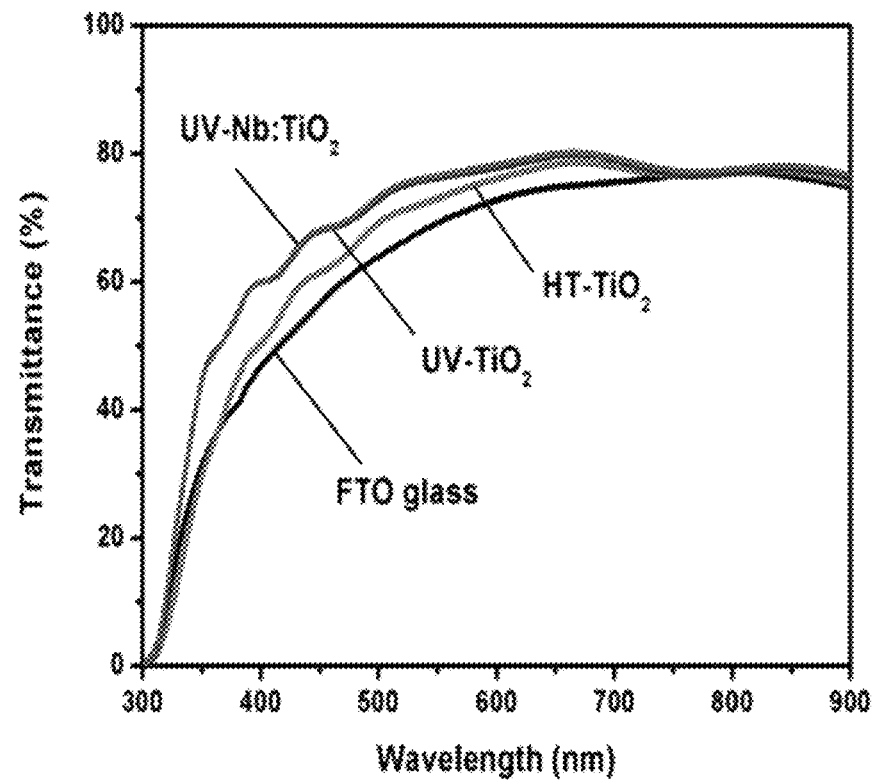
FIG. 6D shows the transmittances of FTO glass, HT-TiO$_2$-coated FTO glass, UV-TiO$_2$-coated FTO glass, and UV-Nb:TiO$_2$-coated FTO glass, the inset of FIG. 6A is a SEM image showing the surface of FTO glass.

FIG. 6A is a SEM image showing the surface of the HT-$TiO_2$-coated FTO glass prepared in Comparative Example 1, FIG. 6B is a SEM image showing the surface of the UV-$TiO_2$-coated FTO glass prepared in Comparative Example 2, FIG. 6C shows cyclic voltammograms of the FTO glass, the HT-$TiO_2$-coated FTO glass, and the UV-$TiO_2$-coated FTO glass, FIG. 6D shows the transmittances of the FTO glass, the HT-$TiO_2$-coated FTO glass, the UV-$TiO_2$-coated FTO glass, and the UV-Nb:$TiO_2$-coated FTO glass. The inset of FIG. 6A is a SEM image showing the surface of the FTO glass.

As shown in FIGS. 6A and 6B, the FTO glass had an irregular texture and a rough surface but the HT-$TiO_2$ and UV-$TiO_2$ electron transport layers coated on the 50 nm thick FTO substrate had smooth surfaces.

To evaluate the blocking effect of the electron transport layer (ETL) against the FTO glass, cyclic voltammetry (CV) was performed. In an aqueous solution of $Fe(CN)_6^{3-/4-}$, reversible redox reactions between $Fe(CN)_6^{3-}$ and $Fe(CN)_6^{4-}$ occur on the FTO surface. It was previously reported that when FTO glass is coated with an electron transport layer (ETL), the peak current density of CV decreases with increasing peak-to-peak separation ($\Delta E_p$) because the FTO surface is blocked by the electron transport layer (ETL).

As shown in FIG. 6C, the UV-$TiO_2$ coated on the FTO glass (Comparative Example 2) exhibited an efficient blocking effect compared to the HT-$TiO_2$ (Comparative Example 1) because of its low current density and large $\Delta E_p$. Therefore, it was confirmed that the UV-treated electron transport layer (ETL) completely blocks holes caused by a more effective charge separation and a lower charge recombination.

As shown in FIG. 6D, the FTO glass coated with the electron transport layer (ETL) showed higher transmittances than the FTO glass because of its decreased surface roughness. Particularly, the UV-treated $TiO_2$ electron transport layers (UV-$TiO_2$ and UV-Nb:$TiO_2$) showed higher transmittances in the range of 300 nm to 650 nm than the HT-$TiO_2$.

Figure 7A:
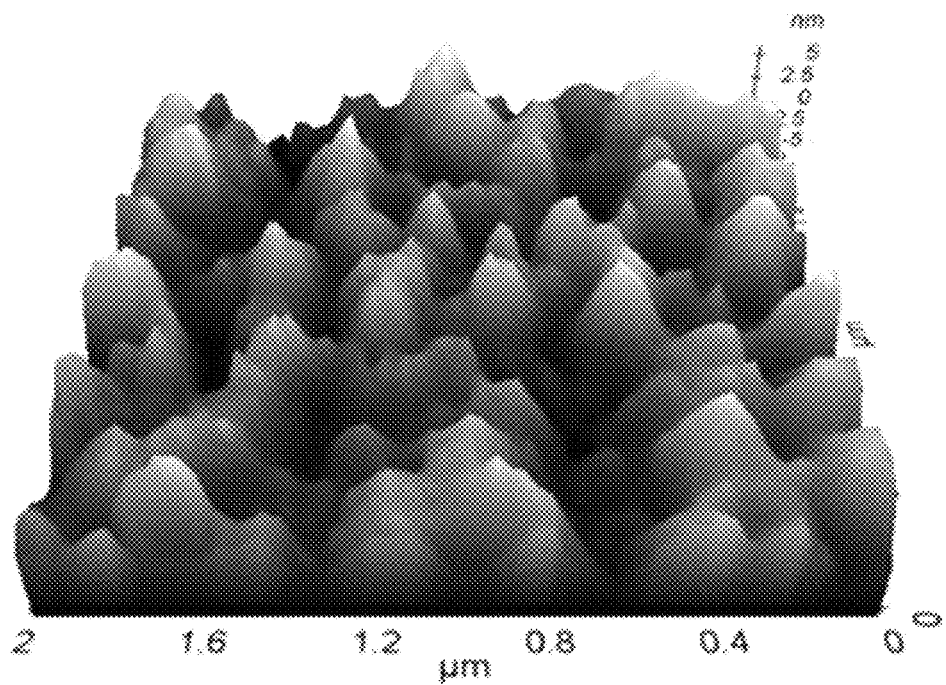
FIGS. 7A and 7B are 3D atomic force microscopy (AFM) images showing the surface morphologies of HT-TiO$_2$-coated ITO glass and UV-TiO$_2$-coated ITO glass, respectively.
Figure 7B:
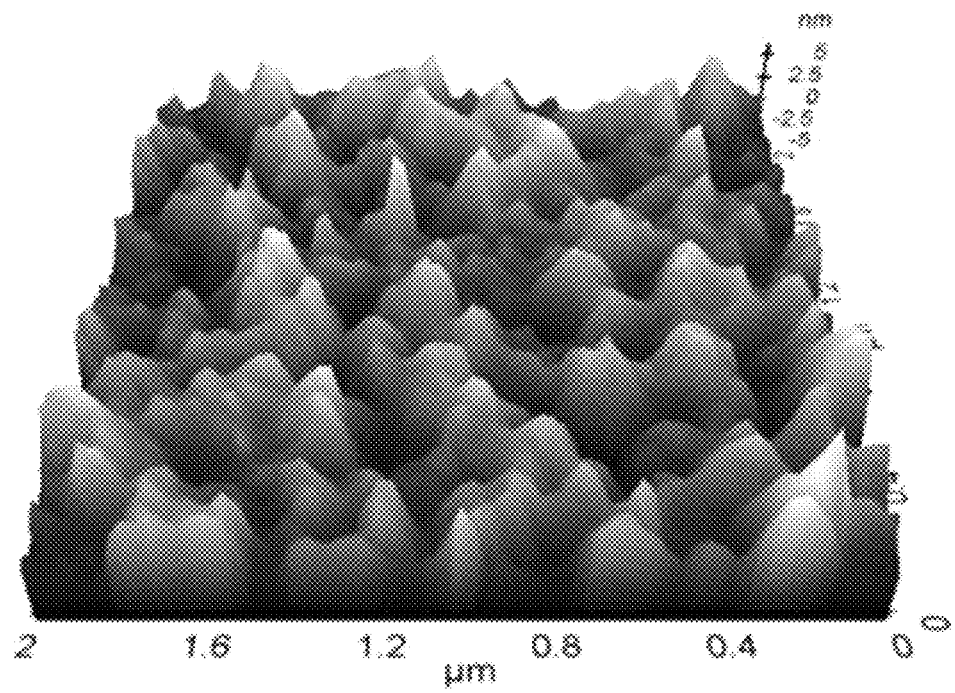

FIGS. 7A and 7B are 3D atomic force microscopy (AFM) images showing the surface morphologies of the HT-$TiO_2$-coated ITO glass and the UV-$TiO_2$-coated ITO glass, respectively.

The surface roughness values of the HT-$TiO_2$ and UV-$TiO_2$ were confirmed by AFM.

The HT-$TiO_2$ had an irregular surface with slightly sparse valleys, appearing as pinholes, whereas the AFM image of the UV-$TiO_2$ showed a uniform and dense surface. The root mean square (RMS) roughness of the ITO glass was 1.0 nm and the surface roughness increased to 4.5 nm when coated with HT-$TiO_2$.

The surface roughness of the UV-$TiO_2$ was 2.3 nm, indicating a more smooth and dense surface than the HT-$TiO_2$. The high uniformity and surface of UV-$TiO_2$ were confirmed by AFM measurements. From the fact that the UV treatment allows the UV-$TiO_2$ to have a smooth and dense surface, the UV-Nb:$TiO_2$ (Example 1) is also believed to have a smooth and dense surface.

Figure 8:
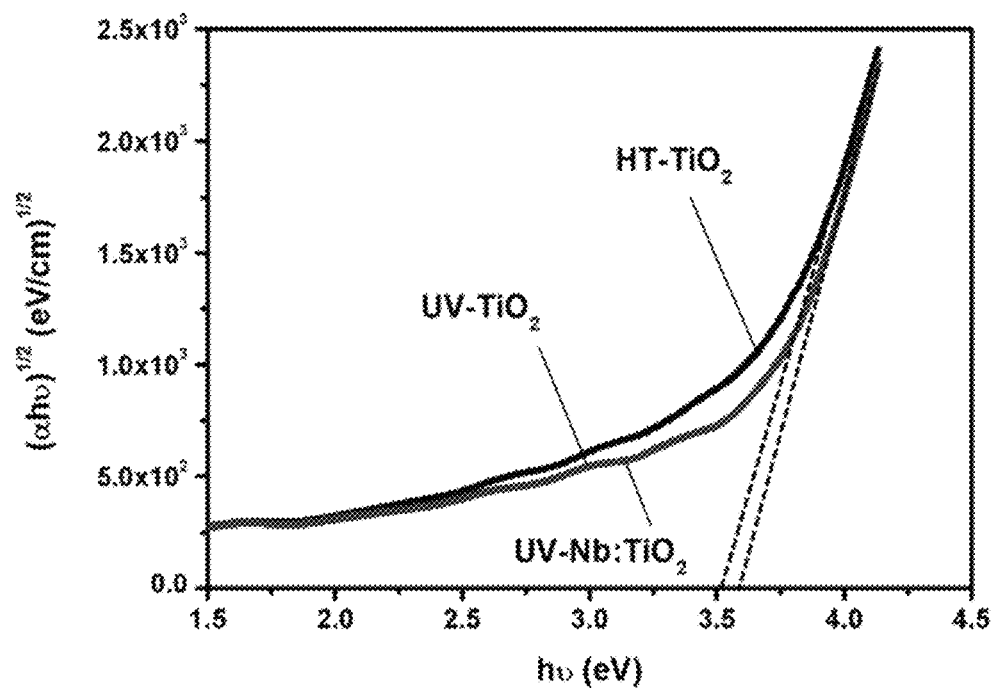
FIG. 8 shows Tauc plots obtained from UV-Vis spectra of HT-TiO$_2$, UV-TiO$_2$, and UV-Nb:TiO$_2$ thin films.

FIG. 8 shows Tauc plots obtained from UV-Vis spectra of the HT-$TiO_2$, UV-$TiO_2$, and UV-Nb:$TiO_2$ thin films.

The absorption coefficient ($\alpha$) of an indirect band gap semiconductor around the band edge is determined by $\alpha h\nu = A(h\nu - E_g)^2$, where A is a constant, $h\nu$ is the photon energy, and $E_g$ is the optical band gap.

As shown in FIG. 8, $E_g$ is determined by extrapolating the tangent to the plot curve. The $E_g$ values of the HT-$TiO_2$ and the UV-$TiO_2$ (or the UV-Nb:$TiO_2$) films were 3.52 eV and 3.62 eV, respectively, indicating that the UV-$TiO_2$ (or the UV-Nb:$TiO_2$) had a higher band gap than the HT-$TiO_2$. Since the UV-$TiO_2$ and the UV-Nb:$TiO_2$ had the same optical band gap, no influence of Nb doping on the optical band gap was observed.

This can be explained by the quantum size effect of the $TiO_2$ nanoparticles originated from the diameter ($\leq 3$ nm) of the titanium dioxide nanoparticles. As a result, the high transparency of the UV-treated $TiO_2$ electron transport layers (UV-$TiO_2$ and UV-Nb:$TiO_2$) is beneficial to the light absorption of the perovskite layer due to their high photocurrent. There was no beneficial effect of Nb doping on the optical properties.

To investigate the effect of Nb doping on electrical properties, 4-point probe measurements were conducted.

The electrical conductivity of the UV-Nb:$TiO_2$ (1 mol % Nb) was $2.65 \times 10^{-4}$ $Scm^{-1}$, which was about 3-fold higher than that of the UV-$TiO_2$ ($0.95 \times 10^{-4}$ $Scm^{-1}$) due to the increased carrier density after Nb doping. The electrical conductivity of the UV-Nb:$TiO_2$ (1 mol % Nb) was also high compared to that of the HT-$TiO_2$ film ($0.25 \times 10^{-4}$ $Scm^{-1}$).

These results are attributed to the 1-dimensional structure of the sol-gel derived $TiO_2$ nanoparticles in the form of a highly transparent and highly packed film for more efficient charge transport.

Planar perovskite solar cells (PSCs) including the HT-$TiO_2$ (Comparative Example 1), UV-$TiO_2$ (Comparative Example 2), and UV-Nb:$TiO_2$ (Example 1) electron transport layers were fabricated on FTO glass. The photovoltaic performance of the perovskite solar cells was investigated.

Figure 9:
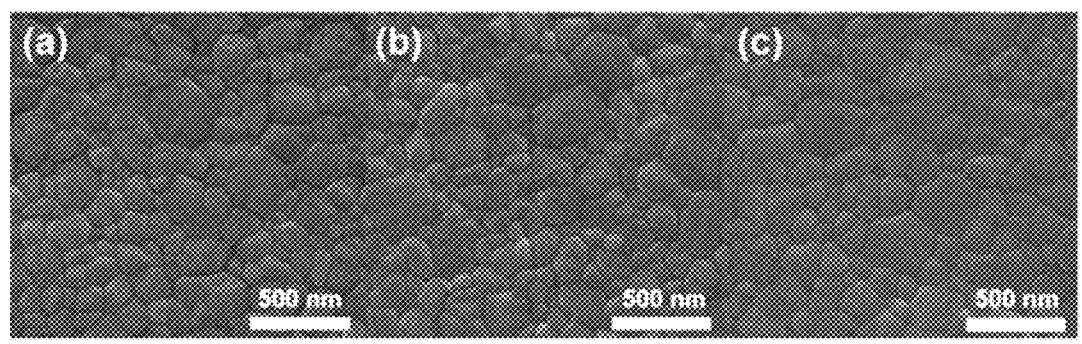
FIG. 9 shows top SEM images of CH$_3$NH$_3$PbI$_3$ perovskite films coated with (a) HT-TiO$_2$, (b) UV-TiO$_2$, and (c) UV-Nb:TiO$_2$ electron transport layers.

FIG. 9 shows top SEM images of $CH_3NH_3PbI_3$ perovskite films coated with (a) the HT-$TiO_2$, (b) the UV-$TiO_2$, and (c) the UV-Nb:$TiO_2$ electron transport layers.

The highly crystalline pinhole free $CH_3NH_3PbI_3$ perovskite layers were prepared by addition of a Lewis base.

Figure 10A:
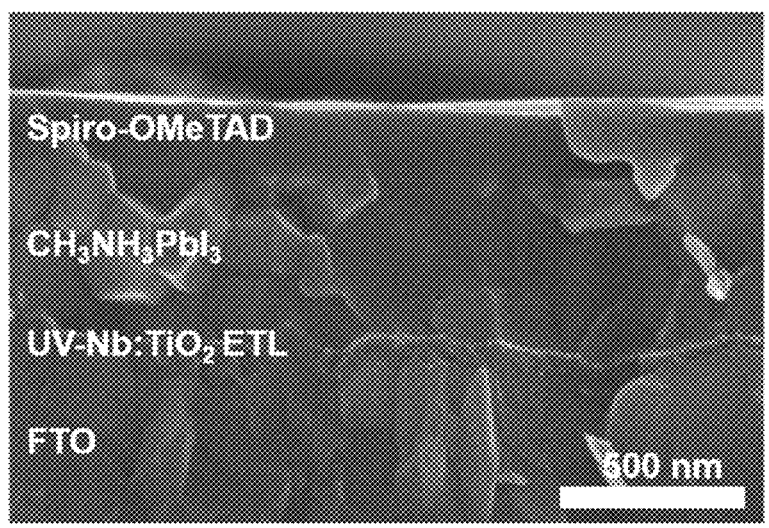
FIG. 10A is a cross-sectional SEM image of a planar PSC including a UV-Nb:TiO$_2$ electron transport layer.
Figure 10B:
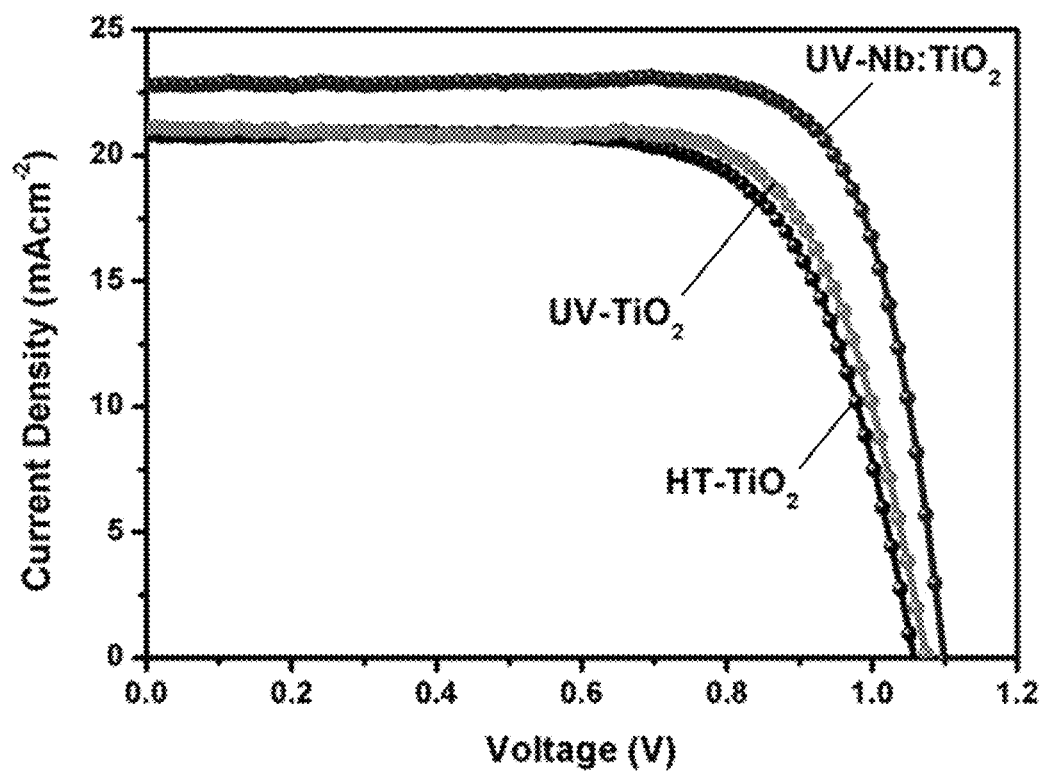
FIG. 10B shows photocurrent density-voltage (J-V) curves of planar PSCs including HT-TiO$_2$, UV-TiO$_2$, and UV-Nb:TiO$_2$ electron transport layers.
Figure 10C:
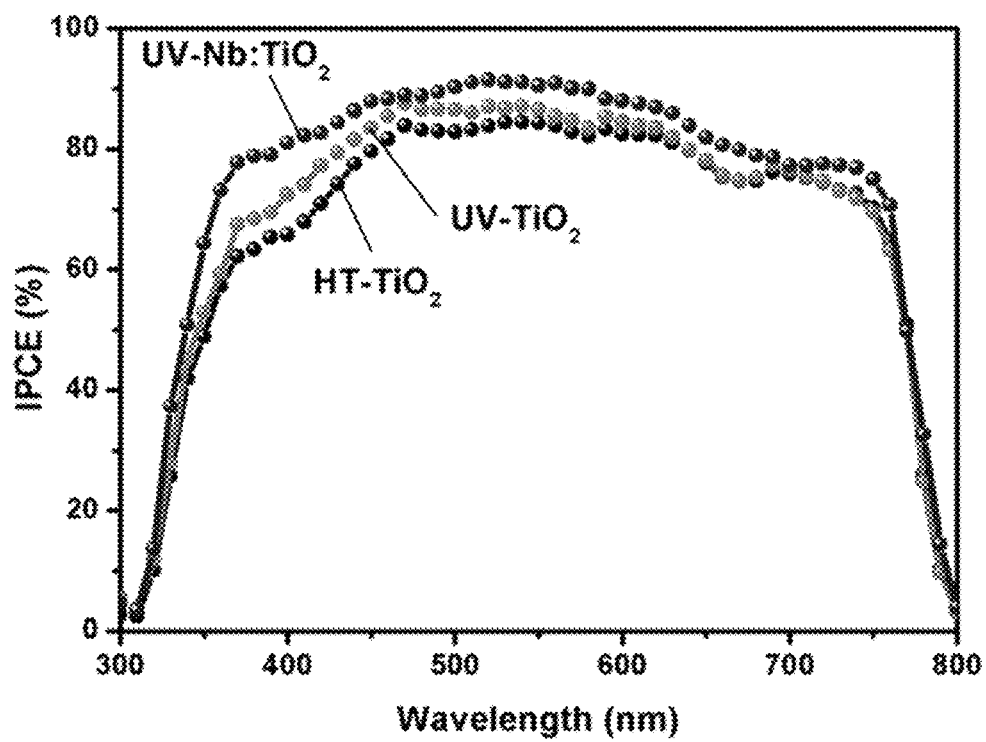
FIG. 10C shows incident photon-to-current conversion efficiency (IPCE) spectra of planar PSCs including HT-TiO$_2$, UV-TiO$_2$, and UV-Nb:TiO$_2$ electron transport layers.

FIG. 10A is a cross-sectional SEM image of the planar PSC including the UV-Nb:$TiO_2$ electron transport layer, FIG. 10B shows photocurrent density-voltage (J-V) curves of the planar PSCs including the HT-$TiO_2$, UV-$TiO_2$, and UV-Nb:$TiO_2$ electron transport layers, and FIG. 10C shows incident photon-to-current conversion efficiency (IPCE) spectra of the planar PSCs including the HT-$TiO_2$, UV-$TiO_2$, and UV-Nb:$TiO_2$ electron transport layers.

In the perovskite solar cell (PSC) shown in FIG. 10A, the 50 nm thick UV-Nb:$TiO_2$ (electron transport layer), 480 nm thick CH$_3$NH$_3$PbI$_3$ (perovskite layer), and 180 nm thick spiro-OMeTAD (hole transport layer) were deposited in this order on FTO glass.

The optical parameter of the planar PSC including the HT-TiO$_2$, UV-TiO$_2$, and UV-Nb:TiO$_2$ electron transport layers are shown in Table 1.

TABLE 1

| Parameters | J$_{sc}$ (mAcm$^{-2}$) | V$_{oc}$ (V) | FF | PCE (%) |
|---|---|---|---|---|
| HT-TiO$_2$ | 20.74 | 1.06 | 0.71 | 15.51 |
| UV-TiO$_2$ | 21.05 | 1.08 | 0.72 | 16.37 |
| UV-Nb:TiO$_2$ | 22.81 | 1.10 | 0.78 | 19.57 |

As shown in Table 1 and FIGS. 10B and 10C, the perovskite solar cell (PSC) including the UV-TiO$_2$ electron transport layer showed improved short circuit current density (J$_{sc}$, 21.05 mAcm$^{-2}$), open-circuit voltage (V$_{oc}$, 1.08 V), fill factor (FF, 0.72), and power conversion efficiency (PCE, 16.37%) compared to the HT-TiO$_2$ perovskite solar cell (PSC). Furthermore, the J$_{sc}$, V$_{oc}$, FF, and PCE perovskite solar cell (PSC) including the UV-Nb:TiO$_2$ electron transport layer were 22.81 mAcm$^{-2}$, 1.10 V, 0.78, and 19.57%, respectively.

As shown in FIG. 10C, the UV-Nb:TiO$_2$-based solar cell (PSC) showed a stronger spectral response and a higher IPCE at 300-750 nm than the UV-TiO$_2$-based solar cell and the HT-TiO$_2$-based solar cell. These results are attributed to the high transparency and electrical conductivity of the UV-Nb:TiO$_2$. From the IPCE spectra, the integrated current density value of each device is in agreement with the J$_{sc}$ value obtained from the J-V curve.

Figure 11:
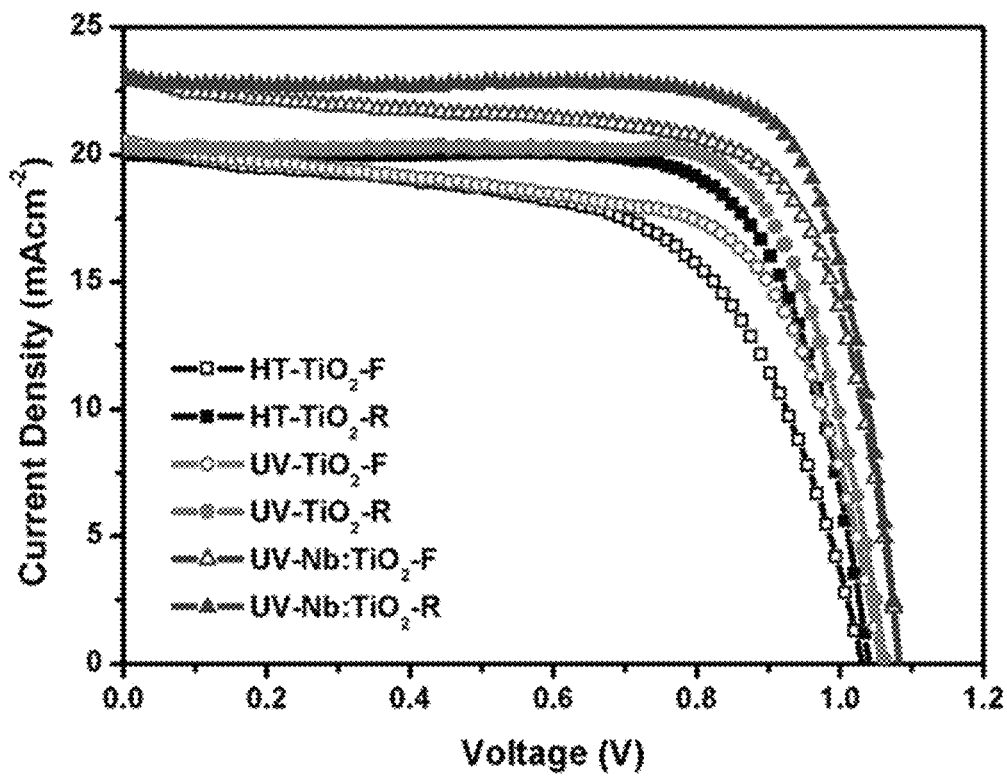
FIG. 11 shows hysteresis between J-V curves of PSCs including HT-TiO$_2$, UV-TiO$_2$, and UV-Nb:TiO$_2$ electron transport layers, which were obtained from different scan directions.

FIG. 11 shows hysteresis between J-V curves of the PSCs including the HT-TiO$_2$, UV-TiO$_2$, and UV-Nb:TiO$_2$ electron transport layers, which were obtained from different scan directions. In FIG. 11, F represents forward scans from J$_{sc}$ to V$_{oc}$ and R represents reverse scans from J$_{sc}$ to V$_{oc}$.

As shown in FIG. 11, the perovskite solar cell (PSC) including the HT-TiO$_2$ showed a large difference between the forward and reverse scans in the J-V curve. However, when the perovskite solar cell (PSC) including the UV-Nb:TiO$_2$ electron transport layer showed the smallest hysteresis in the J-V curve, the hysteresis behavior was reduced.

The improved conductivity of the UV-treated electron transport layer (ETL) was proposed to reduce the hysteresis behavior by the balanced electrons and hole transport rate. The performance and photostability of the perovskite solar cell (PSC) including the UV-Nb:TiO$_2$ electron transport layer during actual operation were evaluated by measuring the steady-state photocurrent density of the perovskite solar cell (PSC).

Figure 12:
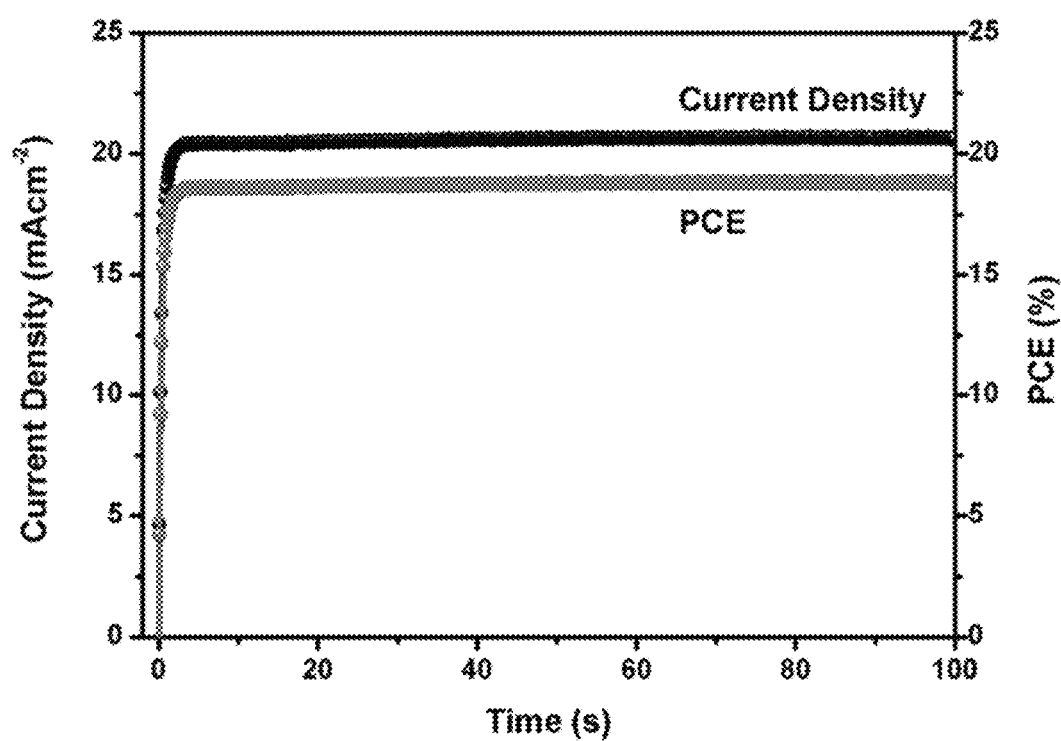
FIG. 12 shows the steady-state photocurrent density of a PSC including a UV-Nb:TiO$_2$ electron transport layer.

FIG. 12 shows the steady-state photocurrent density of the PSC including the UV-Nb:TiO$_2$ electron transport layer.

As shown in FIG. 12, the perovskite solar cell (PSC) including the UV-Nb:TiO$_2$ electron transport layer showed a stable power conversion efficiency (PCE) of 18.78% at the maximum power point voltage (0.91 V).

Figure 13A:
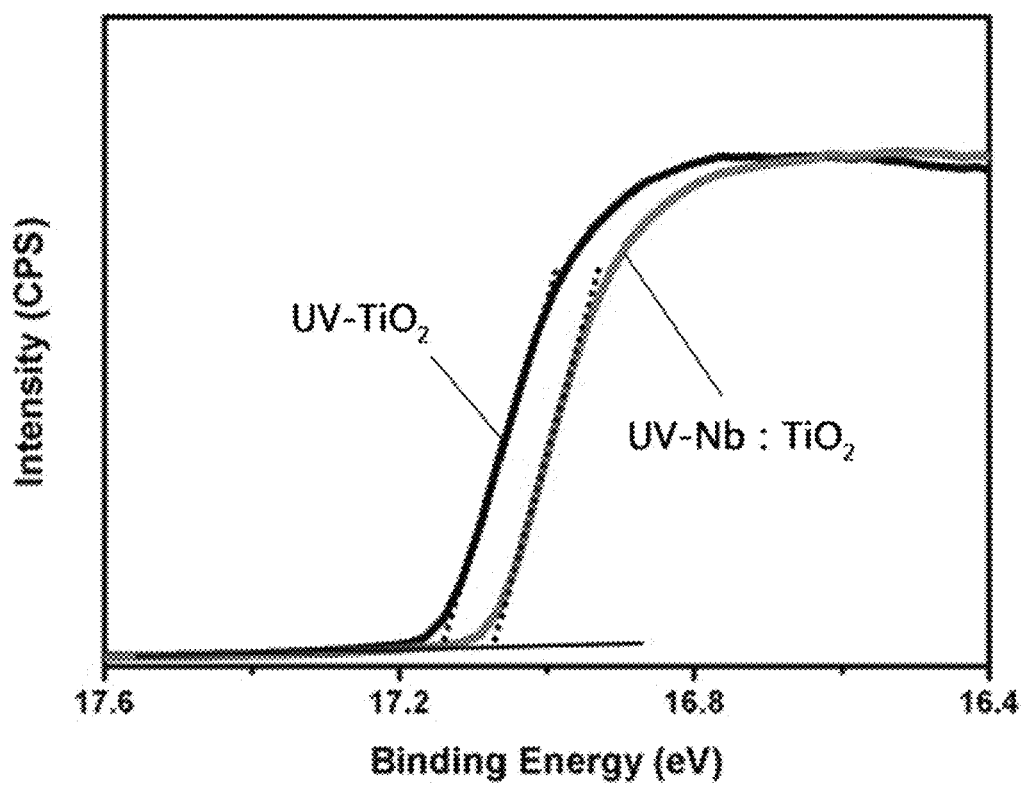
FIG. 13A shows UV photoelectron spectra (UPS) of a UV-Nb:TiO$_2$ electron transport layer
Figure 13B:
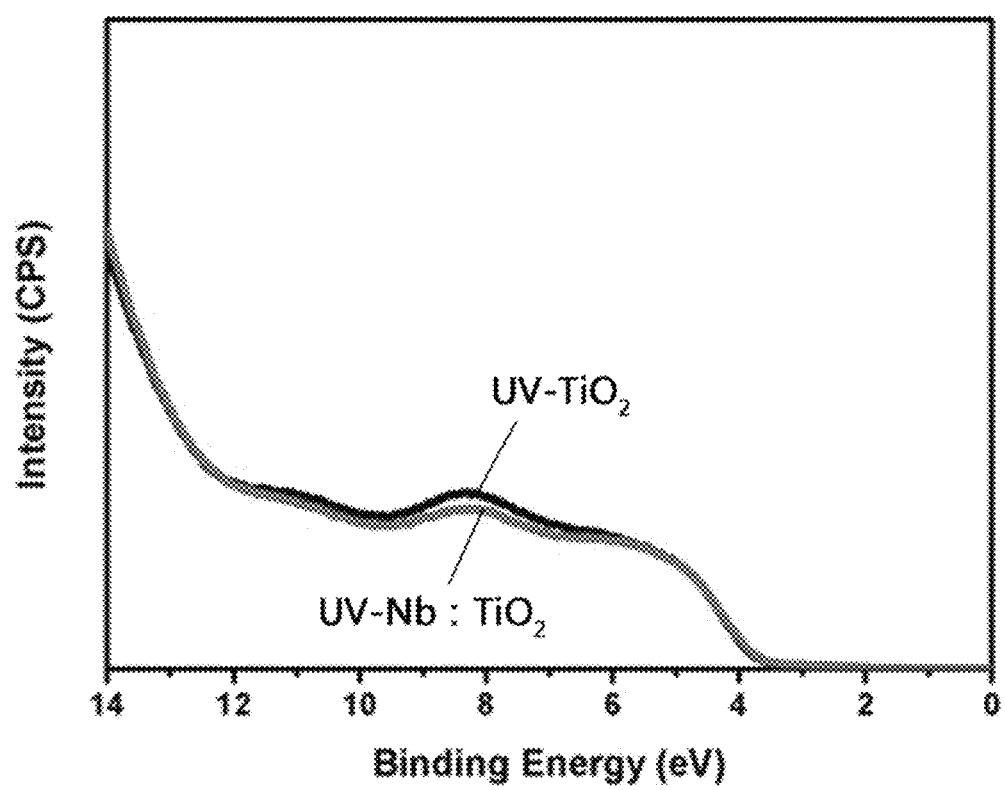
FIG. 13B shows a UV-TiO$_2$ electron transport layer.

FIG. 13 shows UV photoelectron spectra (UPS) of the UV-Nb:TiO$_2$ electron transport layer and the UV-TiO$_2$ electron transport layer.

The Fermi level (E$_F$) of each of the UV-TiO$_2$ and the UV-Nb:TiO$_2$ is obtained by subtracting the binding energy of secondary electron cut-off from the incident photon energy (21.2 eV). The E$_F$ values of the UV-TiO$_2$ and UV-Nb:TiO$_2$ are −4.06 eV and −4.13 eV, respectively.

As shown in FIG. 13, the energy gap between the E$_F$ and the top of valence band (E$_{VB}$) was determined by the point of intersection between the bottom side and the linear portion of the spectrum around the Fermi edge. The E$_F$-E$_{VB}$ values of the UV-TiO$_2$ and the UV-Nb:TiO$_2$ were 3.53 eV and 3.51 eV, respectively, and the bottom of conduction band (E$_{CB}$) values of the UV-TiO$_2$ and the UV-Nb:TiO$_2$ were −3.97 eV and −4.02 eV, respectively, which were obtained by the addition of the band gap (3.62 eV) of the UV-TiO$_2$ and the UV-Nb:TiO$_2$ to their E$_{VB}$ values.

Figure 14A:
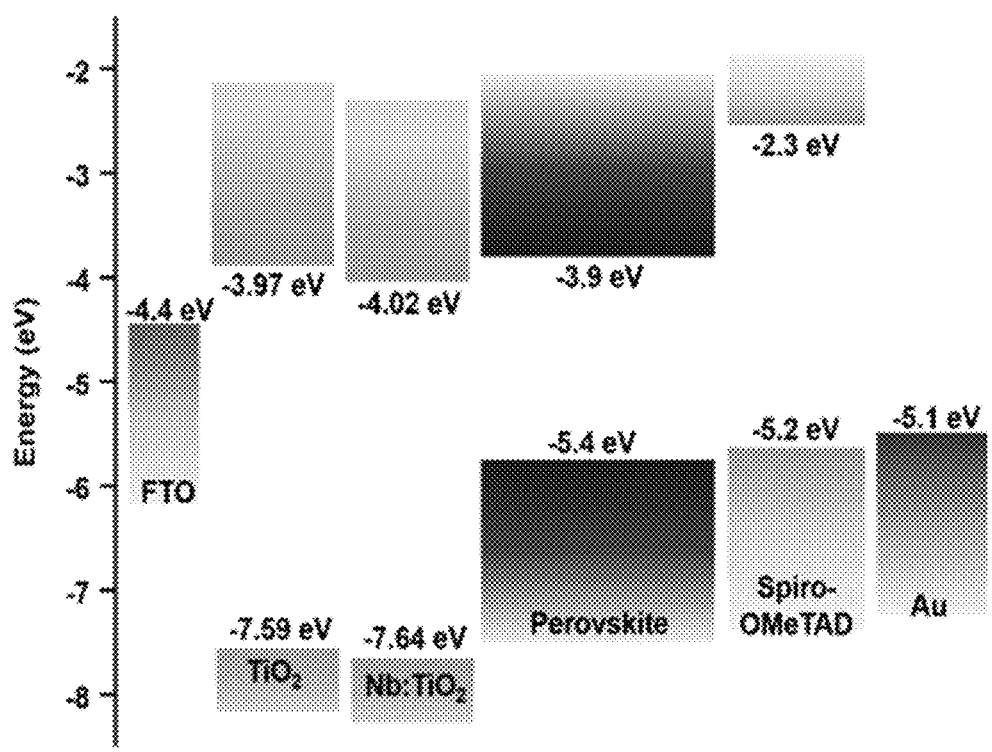
FIG. 14A shows energy level alignment of the individual layers of a PSC.
Figure 14B:
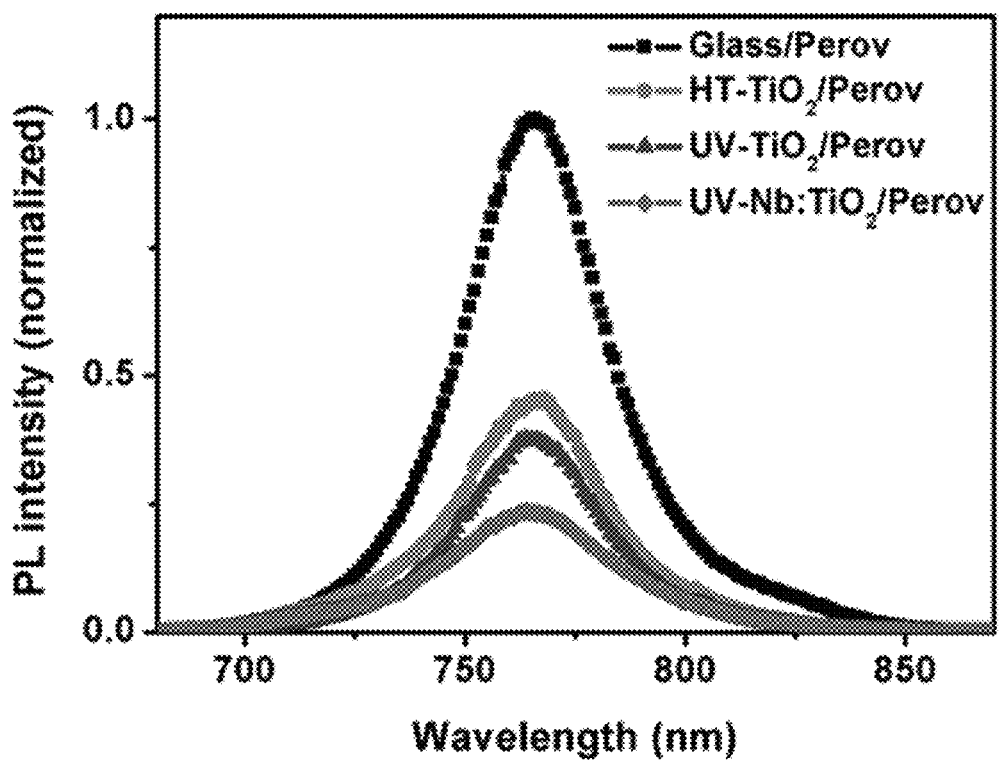
FIG. 14B shows steady-state photoluminescence (PL) spectra of perovskite layers in contact with HT-TiO$_2$, UV-TiO$_2$, and UV-Nb:TiO$_2$ electron transport layers.
Figure 14C:
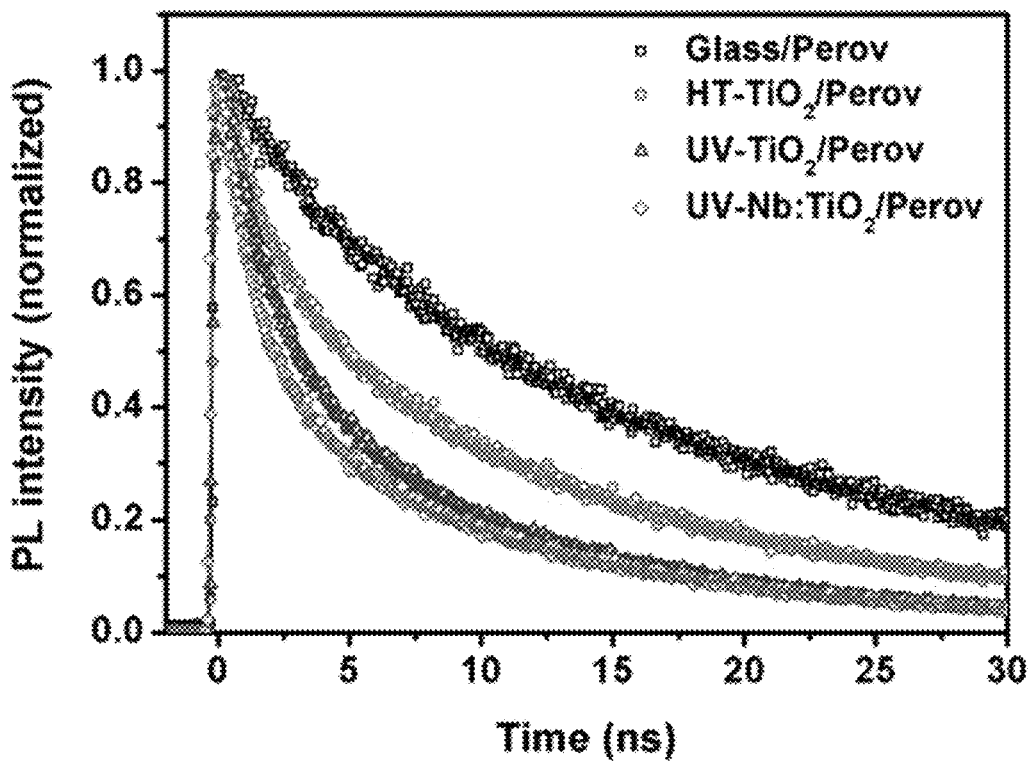
FIG. 14C shows time-resolved photoluminescence (TRPL) spectra of perovskite layers in contact with HT-TiO$_2$, UV-TiO$_2$, and UV-Nb:TiO$_2$ electron transport layers.

FIG. 14A is an energy level diagram of the individual layers of the perovskite solar cell (PSC), FIG. 14B shows steady-state photoluminescence (PL) spectra of the perovskite layers in contact with the HT-TiO$_2$, UV-TiO$_2$, and UV-Nb:TiO$_2$ electron transport layers, and FIG. 14C shows time-resolved photoluminescence (TRPL) spectra of the perovskite layers in contact with the HT-TiO$_2$, UV-TiO$_2$, and UV-Nb:TiO$_2$ electron transport layers.

As shown in FIG. 14A, the Nb—TiO$_2$ has a deeper conduction band minimum (CBM) than TiO$_2$ (−3.97 eV). The deep conduction band edge of the UV-Nb:TiO$_2$ generates improved charge extraction compared to the UV-TiO$_2$ to increase the driving force for electron injection from the perovskite conduction band to the electron transport layer (ETL).

The steady-state photoluminescence (PL) spectra of the perovskite layers were measured and time-resolved photoluminescence (TRPL) decay was performed to investigate the doping effect on charge transfer at the electron transport layer/perovskite interface.

As shown in FIG. 14B, the spectral peaks at 766 nm associated with the intrinsic fluorescence emission of CH$_3$NH$_3$PbI$_3$ (perovskite) disappeared upon contact with the ETL, indicating charge transfer from the perovskite to the ETL.

Specifically, the photoluminescence (PL) density of the UV-TiO$_2$/perovskite was lower than that of the HT-TiO$_2$/perovskite (HT-TiO$_2$/perov) and the PL density of the UV-Nb:TiO$_2$/perovskite was lower than that of the UV-TiO$_2$/perovskite. These results reveal that charge extraction from the perovskite is the most effective in the UV-Nb:TiO$_2$ electron transport layer.

The PL lifetime was obtained by fitting the TR-PL spectra with a biexponential decay function (FIG. 14C). The fast decay is regarded as the quenching of carriers from the perovskite in contact with the electron transport layer and the slow decay is related to the radioactive decay in the perovskite layer.

Parameters for the glass/perovskite, HT-TiO$_2$/perovskite, UV-TiO$_2$/perovskite, and UV-Nb:TiO$_2$/perovskite are shown in Table 2.

TABLE 2

| Parameters | a$_1$ (%) | τ$_1$ (ns) | a$_2$ (%) | τ$_2$ (ns) | τ$_{avg}$ |
|---|---|---|---|---|---|
| Glass/perov | 56.6 | 26.6 | 43.4 | 7.9 | 18.5 |
| HT-TiO$_2$/perov | 56.1 | 16.0 | 43.9 | 2.5 | 10.1 |
| UV-TiO$_2$/perov | 38.9 | 13.3 | 61.1 | 2.5 | 6.7 |
| UV-Nb:TiO$_2$/perov | 37.6 | 12.6 | 62.4 | 1.8 | 5.8 |

As shown in Table 2 and FIG. 14C, charge extraction from the electron transport layers to the perovskite layer was dominant in the electron transport layer/perovskite structures compared to in the glass/perovskite. This fast decay decreased the decay lifetime accompanied by increased amplitude. The average lifetime of the HT-TiO$_2$/perovskite layer was 10.1 ns. When the UV-TiO$_2$ electron transport layer was used, the average lifetime was decreased to 6.7 ns.

The average decay lifetime of the UV-Nb:TiO$_2$/perovskite layer was 5.8 ns, which was faster than that of the UV-TiO$_2$/perovskite layer, and decreased from 2.5 nm to 1.8 ns with increased amplitude.

Therefore, it was confirmed that a significant improvement in the sunlight performance of the UV-Nb:TiO$_2$ electron transport layer compared to the UV-TiO$_2$ due to the ultraviolet photoelectron spectroscopy (UPS) and steady-state photoluminescence (PL) characteristics is attributed to improved charge extraction by a synergistic effect between energy level transfer and increased electrical conductivity. These results emphasize the importance of doping in the organic electron transport layer (ETL), which is because of the energy level alignment with perovskite in the high performance perovskite solar cell (PSC).

The novel method of the present invention is suitable for the preparation of an efficient electron transport layer (ETL) and is applicable to the fabrication of a high performance flexible perovskite solar cell (PSC). The UV-Nb:TiO$_2$ electron transport layer of the present invention is suitable for use in a flexible perovskite solar cell (PSC).

Figure 15A:
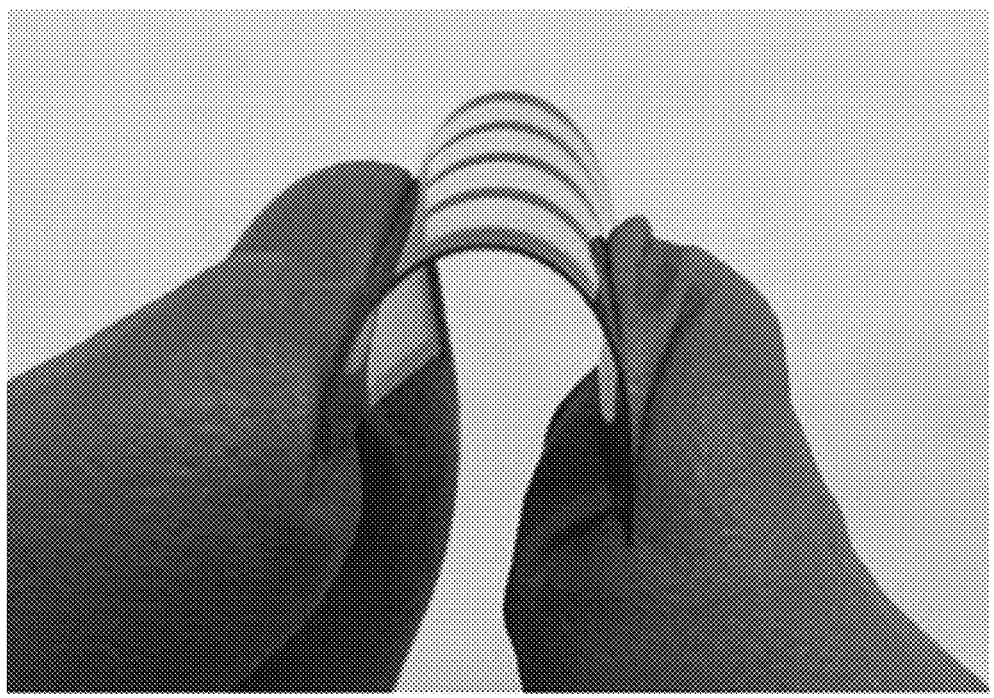
FIG. 15A is a photograph of a PSC including a UV-Nb:TiO$_2$ electron transport layer coated on an ITO/PEN substrate.
Figure 15B:
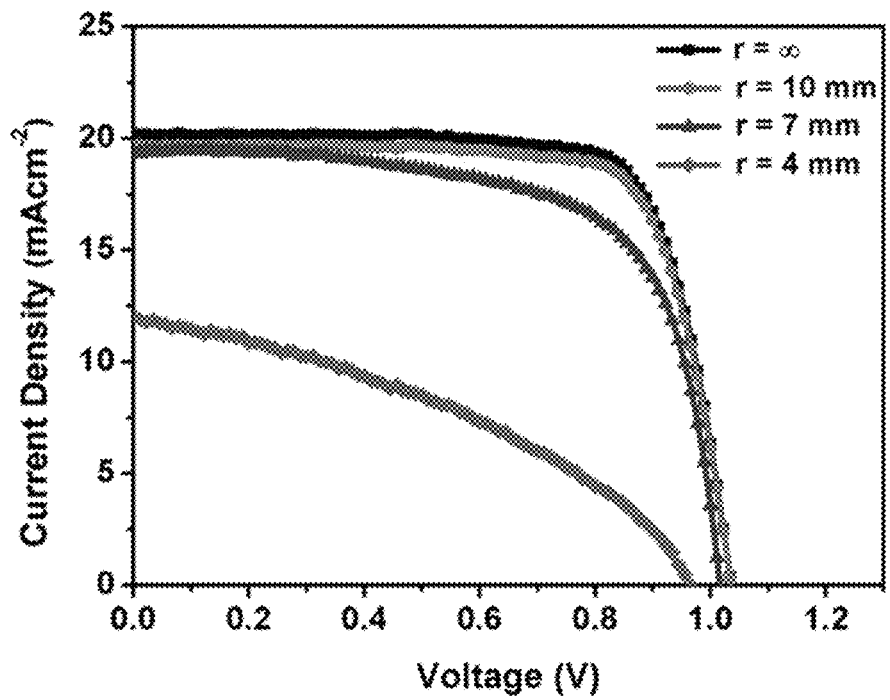
FIG. 15B shows J-V curves of the PSC obtained after recovery from bending at different radii (r)
Figure 15C:
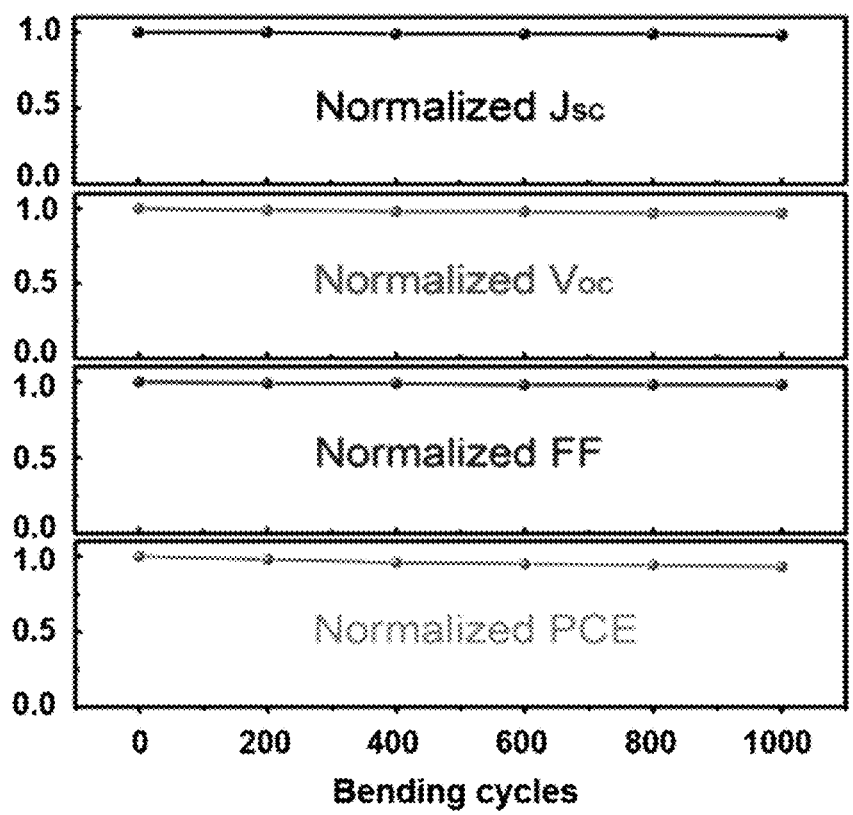
FIG. 15C shows photovoltaic parameters of the PSC after bending at r=15 mm for 1000 cycles of bending.

FIG. 15A is a photograph of the PSC including the UV-Nb:TiO$_2$ electron transport layer coated on an ITO/PEN substrate, FIG. 15B shows J-V curves of the flexible perovskite solar cell obtained after recovery from bending at different radii (r), and FIG. 15C shows photovoltaic parameters ($J_{sc}$, $V_{oc}$, FF, and PCE) of the flexible perovskite solar cell after bending at r=15 mm for 1000 cycles of bending.

Figure 16:
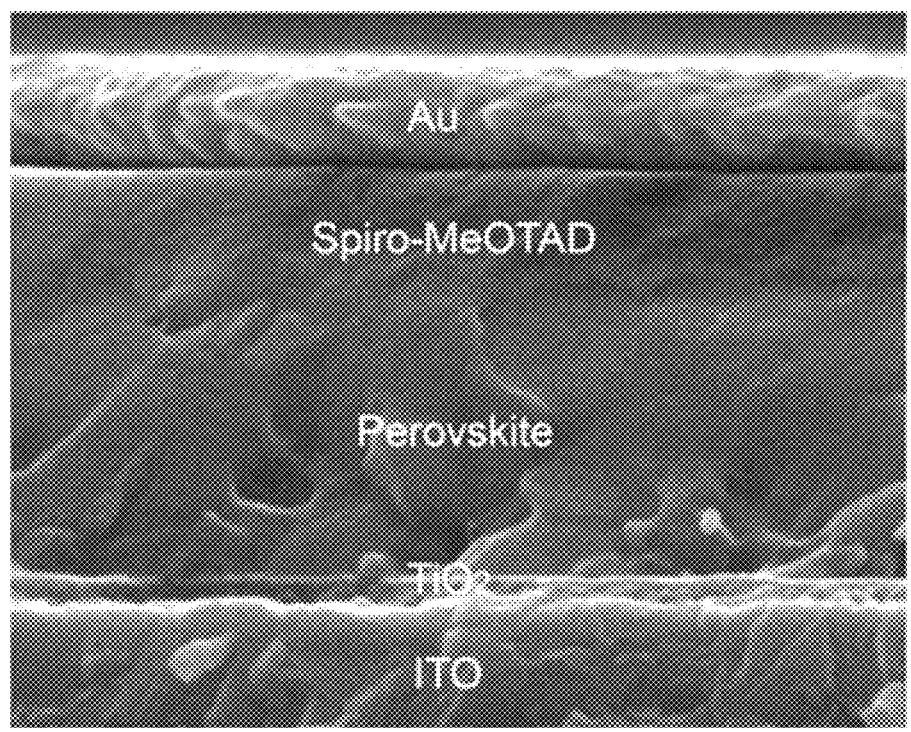
FIG. 16 is a cross-sectional SEM image of the PSC of FIG. 15A.

FIG. 16 is a cross-sectional SEM image of the flexible perovskite solar cell (PSC) of FIG. 15A.

In the flexible perovskite solar cell (PSC) shown in FIG. 15A, the UV-Nb:TiO$_2$ electron transport layer coated on an ITO/PEN substrate, a perovskite layer, spiro-OMeTAD (hole transport layer), and an Au electrode layer were deposited in this order, as shown in FIG. 16.

Photovoltaic parameters of the flexible perovskite solar cell after recovery from bending at different radii (r) are shown in Table 3.

TABLE 3

| Parameters | $J_{sc}$ (mAcm$^{-2}$) | $V_{oc}$ (V) | FF | PCE (%) |
| --- | --- | --- | --- | --- |
| r = ∞ | 20.20 | 1.04 | 0.76 | 16.01 |
| r = 10 mm | 19.71 | 1.04 | 0.76 | 15.58 |
| r = 7 mm | 19.33 | 1.02 | 0.67 | 13.27 |
| r = 4 mm | 12.02 | 0.97 | 0.38 | 4.41 |

As shown in Table 3 and FIG. 15B, the initial power conversion efficiency (PCE), $J_{sc}$, $V_{oc}$, and FF of the flexible perovskite solar cell (PSC) were 16.01%, 20.20 mA cm$^{-2}$, 1.04 V, and 0.76, respectively.

The power conversion efficiency (PCE) values of the PSC after bending at r=10 mm, 7 mm, and 4 mm were 15.58%, 13.27%, and 4.41%, respectively. The weak reduction in efficiency at r=7 mm is attributed to the plastic deformation of the solar cell. As previously reported, the soft ITO was broken at r=4 mm.

As shown in FIG. 15C, the initial efficiency of the flexible perovskite solar cell (PSC) was 15.42%. After 1000 cycles of bending, the efficiency was decreased to 14.45%, which corresponds to 93.7% of the initial value. The other photovoltaic parameters ($J_{sc}$, $V_{oc}$, and FF) showed a similar tendency to decrease, with only a ~2% reduction after 1000 cycles of bending.

Therefore, the mechanical durability of the flexible perovskite solar cell (PSC) was demonstrated until 1000 cycles of bending at r=15 mm. All layers of the flexible perovskite solar cell (PSC) maintained their mechanical flexibility until r=15 mm.

In the present invention, the sol-gel derived TiO$_2$ nanoparticles were treated with UV to photocatalytically decompose the organic ligand and induce the fusion of the nanoparticles, enabling the preparation of the TiO$_2$ electron transport layer at low temperature. The TiO$_2$ electron transport layer was used to fabricate the perovskite solar cell (PSC) with high performance.

The UV-Nb:TiO$_2$ electron transport layer shows a higher transmittance and has a denser surface than the TiO$_2$ film having undergone sintering at high temperature. Particularly, the Nb doping shows improved electrical conductivity and a downward shift of Fermi level, which is advantageous for charge extraction.

Specifically, the planar perovskite solar cell (PSC) employing the UV-Nb:TiO$_2$ as an electron transport layer (ETL) showed high power conversion efficiencies (PCE) of 16.01% for a flexible ITO/PEN substrate and 19.57% for hard FTO glass.

—Fabrication of Perovskite Solar Cells—

Perovskite Layer 1 mmol of PbI$_2$ (99.9985%, Alfar Aesar), 1 mmol of CH$_3$NH$_3$I (Dyesol), and 1 mmol of dimethyl sulfoxide (DMSO, 99.9%, Aldrich) were added to 600 mg of N,N-dimethylformamide (DMF, 99.8%, Alfa Aesar) to prepare a perovskite solution. To the solution was added dropwise diethyl ether with two-stage rapid stirring. The mixture was slowly spin-coated on each of the electron transport layers prepared in Example 1 and Comparative Examples 1-2 at 1000 rpm and 4000 rpm for 20 sec. Thereafter, the coated electron transport layer was heated at 100° C. for 3 min to form a dark perovskite layer.

Hole Transport Layer

A mixture of 2,2',7,7'-tetrakis(N,N-p-dimethoxyphenyl-amine)-9,9'-spirobifluorene (56 mg, spiro-OMeTAD, Merck), 4-tert-butylpyridine (30 mg, 96%, Aldrich), chlorobenzene (1 ml, 99.8%, Aldrich), and bis(trifluoromethane) sulfonimide lithium salt (6 mg, 99.95%, Aldrich) was coated on the perovskite layer at 2500 rpm for 20 s.

Electrode Layer

An 80 nm thick Au electrode was formed on the hole transport layer by shadow mask thermal evaporation.

—Instruments—

The morphologies of the TiO$_2$ nanoparticles and the films were measured by field emission scanning electron microscopy (FESEM, Inspect F, FEI), high-resolution transmission electron microscopy (HR-TEM, Talos F200X, FEI), and atomic force microscopy (AFM, XE-100, Park Systems).

The crystal structure of the TiO$_2$ nanoparticles was characterized using a powder X-ray diffractometer (XRD, D/MAX-2500, Rigaku) with Cu Kα radiation (wavelength 1.541 Å).

The compositions of the UV-treated TiO$_2$ films were investigated using an ATR-FTIR spectrometer (Spectrum 100, PerkinElmer), and XPS and UPS measurements were conducted using a monochromator Al Kα (1486.6 eV) for XPS and a scanning XPS microprobe (PHI 5000 VersaProbe, Ulvac-PHI) with HeI (21.2 eV) for UPS, respectively.

For the measurement of electrical conductivity, a Keithley 2182A nanovoltmeter and a four-point probe connected to a Keithley 6220 precision current source were used. The optical properties of the TiO$_2$ thin films was measured using a UV-vis spectrophotometer (Lambda 35, Perkin Elmer).

Electrochemical workstation (CHI600C, CH Instruments, Inc.) was used for cyclic voltammetry (CV) measurement. The cyclic voltammograms were recorded in a 3-electrode configuration using a Ag/AgCl reference electrode and a Pt wire counter electrode. The CV electrolyte was an aqueous solution containing 0.5 mM $K_4Fe(CN)_6$, 0.5 mM $K_3Fe(CN)_6$, and 0.5 M KCl.

The current density-voltage (J-V) curves were measured using a Keithley model 2400 source measurement unit and a solar simulator equipped with a 1000 W xenon lamp (Yamashida Denso, YSS-50S).

A Si solar cell calibrated by the National Renewable Energy Laboratory (NREL) was used to adjust the light intensity to the AM 1.5G 1 sun condition (100 mW $cm^{-2}$). During all J-V measurements, non-reflective black masks were attached to the devices to exclude diffused light scattering.

The active area of each device (0.1-0.15 $cm^2$) was measured using an optical microscope.

The incident photon-to-current conversion efficiency (IPCE) was measured using an IPCE measurement system (PV Measurement, Inc.). The steady-state photoluminescence (PL) spectra of perovskite films were obtained by excitation at 550 nm using a Fluorolog3 photoluminescence spectrometer system with a monochromator (iHR320, HORIBA Scientific).

Time-resolved photoluminescence (TR-PL) measurements were performed at the PL maxima of the $CH_3NH_3PbI_3$ perovskite, using time-correlated single photon counting module (TCSPC, MPD-PDM Series DET-40 photon counting detector and Pendulum CNT-91 frequency counter) combined with a monochromator as the detector, and a second-harmonic generated 400 nm laser as the excitation source derived from 800 nm Ti: sapphire laser (Mai Tai, Spectra-Physics).

What is claimed is:

1. A method for preparing an electron transport layer for a flexible perovskite solar cell, comprising (A) mixing a titanium precursor, a transition metal precursor, and an organic ligand to prepare transition metal-doped titanium dioxide particles of the electron transport layer, thereby the organic ligand is capped on the transition metal-doped titanium dioxide particles and (B) irradiating the organic ligand capped transition metal-doped titanium dioxide particles of the electron transport layer with UV wavelength in a range of 200 to 400 nm to decompose, remove the organic ligand, and induce fusion of the transition metal-doped titanium dioxide particles, thereby resulting in high density of the transition metal-doped titanium dioxide particles, wherein the metal-doped titanium dioxide particles of the electron transport layer were synthesized by a non-hydrolytic sol-gel reaction.

2. The method according to claim 1, wherein, in step (A), the transition metal precursor is selected from the group consisting of scandium (III) triflate, yttrium borate, yttrium acetate hydrate, lanthanum nitrate, niobium ethoxide isopropoxide, niobium alkoxides, ammonium metavanadate, tantalum ethoxide, and mixtures thereof.

3. The method according to claim 1, wherein, in step (A), the transition metal precursor is used in an amount of 1 to 5 mol %, based on the total moles of the mixture of the titanium precursor, the transition metal precursor, and the organic ligand.

4. The method according to claim 1, wherein, in step (A), the titanium precursor and the organic ligand are mixed in a molar ratio of 1:2-5.

5. The method according to claim 1, wherein, in step (A), the mixture of the titanium precursor, the transition metal precursor, and the organic ligand is heated at 250 to 300° C. for 1 to 3 hours.

6. The method according to claim 1, wherein, in step (B), the transition metal-doped titanium dioxide particles are irradiated with UV for 40 to 120 minutes.

* * * * *